US007533361B2

(12) United States Patent
Edwards

(10) Patent No.: US 7,533,361 B2
(45) Date of Patent: May 12, 2009

(54) SYSTEM AND PROCESS FOR MANUFACTURING CUSTOM ELECTRONICS BY COMBINING TRADITIONAL ELECTRONICS WITH PRINTABLE ELECTRONICS

(75) Inventor: Chuck Edwards, Rio Rancho, NM (US)

(73) Assignee: Cabot Corporation

( * ) Notice: Subject to any disclaimer, the term of this patent is extended or adjusted under 35 U.S.C. 154(b) by 306 days.

(21) Appl. No.: 11/331,191

(22) Filed: Jan. 13, 2006

(65) Prior Publication Data

US 2006/0190918 A1 Aug. 24, 2006

Related U.S. Application Data

(60) Provisional application No. 60/695,416, filed on Jul. 1, 2005, provisional application No. 60/643,629, filed on Jan. 14, 2005, provisional application No. 60/643,577, filed on Jan. 14, 2005, provisional application No. 60/643,578, filed on Jan. 14, 2005.

(51) Int. Cl.
*G06F 17/50* (2006.01)
*H03K 17/693* (2006.01)

(52) U.S. Cl. .............................. 716/15; 716/12; 716/13; 716/14; 438/6; 438/129; 438/589; 257/734

(58) Field of Classification Search ............. 716/16–21; 438/9, 128–129, 589–599; 257/734–786
See application file for complete search history.

(56) References Cited

U.S. PATENT DOCUMENTS 2,785,964 A 3/1957 Pollock
3,313,632 A 4/1967 Langley et al. .................. 106/1
3,401,020 A 9/1968 Kester et al.

(Continued)

FOREIGN PATENT DOCUMENTS

EP 0 410 765 A3 7/1990

(Continued)

OTHER PUBLICATIONS

All-Polymer Thin Film Transistors Fabricated by High-Resolution Ink-jet Printing, Kawase, T., et al., "IEEE International Electron Devices Meeting", pp. 25.5.1-25.5.4 (2000).

(Continued)

*Primary Examiner*—Thuan Do
*Assistant Examiner*—Nghia M Doan
(74) *Attorney, Agent, or Firm*—Katten Muchin Rosenman LLP

(57) ABSTRACT

A system and process for manufacturing custom printed circuit boards on pre-provided substrates, wherein the substrate is pre-provided with standard integrated circuits. The standard integrated circuits are pre-provided on the substrate in a conventional manner, such as by standard integrated circuit technologies, in many different packing technologies. The user designs the custom printed circuit board using a design tool to perform one or more specific electronic functions, based on the pre-provided electronic devices, and/or custom designed and direct printed electronic devices. The electronic devices includes transistors, resistors, capacitors, among other types of devices. The system and process allows users to customize standard "generic" circuit boards with some known electronic functions for their own particular application. Examples of such uses include displays, the automotive industry and many others.

16 Claims, 12 Drawing Sheets

U.S. PATENT DOCUMENTS

| | | | |
|---|---|---|---|
| 3,683,382 A | 8/1972 | Ballinger | 346/74 |
| 3,814,696 A | 6/1974 | Verdone et al. | 252/317 |
| 3,922,355 A | 11/1975 | Kotthoff | |
| 3,922,388 A | 11/1975 | Schebalin | |
| RE28,972 E | 9/1976 | Weber et al. | |
| 4,019,188 A | 4/1977 | Hochberg et al. | 346/75 |
| 4,105,483 A | 8/1978 | Lin | 156/154 |
| 4,122,062 A | 10/1978 | Monte et al. | 260/42.14 |
| 4,130,671 A | 12/1978 | Nagesh et al. | 427/125 |
| 4,170,480 A | 10/1979 | Ikenoue et al. | 96/114.1 |
| 4,186,244 A | 1/1980 | Deffeyes et al. | 428/570 |
| 4,211,668 A | 7/1980 | Tate | 252/316 |
| 4,255,291 A | 3/1981 | Needes et al. | 252/578 |
| 4,266,229 A | 5/1981 | Mansukhani | 346/1.1 |
| 4,289,534 A | 9/1981 | Deffeyes et al. | 106/1.14 |
| 4,333,966 A | 6/1982 | Deffeyes et al. | 427/96 |
| 4,370,308 A | 1/1983 | Williams et al. | |
| 4,381,945 A | 5/1983 | Nair | 106/1.14 |
| 4,407,674 A | 10/1983 | Ehrreich | 75/251 |
| 4,416,932 A | 11/1983 | Nair | 428/209 |
| 4,418,099 A | 11/1983 | Cuevas et al. | 427/229 |
| 4,419,383 A | 12/1983 | Lee | 427/47 |
| 4,463,030 A | 7/1984 | Deffeyes et al. | 427/216 |
| 4,487,811 A | 12/1984 | Eichelberger et al. | 428/546 |
| 4,508,753 A | 4/1985 | Stepan | 427/53.1 |
| 4,517,252 A | 5/1985 | Hugh | 428/553 |
| 4,539,041 A | 9/1985 | Figlarz et al. | 75/0.5 |
| 4,548,879 A | 10/1985 | St. John et al. | 427/96 |
| 4,599,277 A | 7/1986 | Brownlow et al. | 428/552 |
| 4,622,069 A | 11/1986 | Akai et al. | 106/1.11 |
| 4,627,875 A | 12/1986 | Kobayashi et al. | 106/22 |
| 4,650,108 A | 3/1987 | Gallagher | 228/124 |
| 4,668,533 A | 5/1987 | Miller | 427/98 |
| 4,720,418 A | 1/1988 | Kuo | |
| 4,753,821 A | 6/1988 | Giesecke et al. | 427/98 |
| 4,775,439 A | 10/1988 | Seeger, Jr. et al. | 156/231 |
| 4,808,274 A | 2/1989 | Nguyen | 204/15 |
| 4,857,241 A | 8/1989 | Straw et al. | 261/152 |
| 4,859,241 A | 8/1989 | Grundy | 106/114 |
| 4,877,451 A | 10/1989 | Winnik et al. | 106/23 |
| 4,877,647 A | 10/1989 | Klabunde | 427/123 |
| 4,879,104 A | 11/1989 | List et al. | |
| 4,891,242 A | 1/1990 | Ito et al. | 437/53.1 |
| 4,892,798 A | 1/1990 | Lamanna et al. | 430/38 |
| 4,931,168 A | 6/1990 | Watanabe et al. | 204/284 |
| 4,931,323 A | 6/1990 | Manitt et al. | 427/53.1 |
| 4,948,623 A | 8/1990 | Beach et al. | 427/35 |
| 4,959,430 A | 9/1990 | Jonas et al. | 526/257 |
| 5,011,627 A | 4/1991 | Lutz et al. | |
| 5,028,473 A | 7/1991 | Vitriol et al. | 428/137 |
| 5,039,552 A | 8/1991 | Riemer | 427/96 |
| 5,045,141 A | 9/1991 | Salensky et al. | 156/240 |
| 5,049,434 A | 9/1991 | Wasulko | 428/202 |
| 5,057,363 A | 10/1991 | Nakanishi | 428/321.5 |
| 5,059,242 A | 10/1991 | Firmstone et al. | 106/1.23 |
| 5,075,262 A | 12/1991 | Nguyen et al. | 501/19 |
| 5,091,003 A | 2/1992 | Boaz | 106/20 |
| 5,121,127 A | 6/1992 | Toriyama | 343/700 |
| 5,132,248 A | 7/1992 | Drummond et al. | |
| 5,139,818 A | 8/1992 | Mance | 427/54.1 |
| 5,148,355 A | 9/1992 | Lowe et al. | |
| 5,153,023 A | 10/1992 | Orlowski et al. | 427/555 |
| 5,160,366 A | 11/1992 | Shibata | 75/232 |
| 5,173,330 A | 12/1992 | Asano et al. | 427/558 |
| 5,176,744 A | 1/1993 | Muller | 106/1.26 |
| 5,176,764 A | 1/1993 | Abbott et al. | 152/158 |
| 5,183,784 A | 2/1993 | Nguyen et al. | 501/19 |
| 5,215,820 A | 6/1993 | Hosokawa et al. | 428/403 |
| 5,216,207 A | 6/1993 | Prabhu et al. | 174/256 |
| 5,244,538 A | 9/1993 | Kumar | 156/643 |
| 5,250,229 A | 10/1993 | Hara et al. | 252/518 |
| 5,270,368 A | 12/1993 | Lent et al. | 524/236 |
| 5,281,261 A | 1/1994 | Lin | |
| 5,312,480 A | 5/1994 | Lotze et al. | 106/1.13 |
| 5,312,674 A | 5/1994 | Haertling et al. | 428/210 |
| 5,329,293 A | 7/1994 | Liker | 347/11 |
| 5,332,646 A | 7/1994 | Wright et al. | 430/137 |
| 5,366,760 A | 11/1994 | Fujii et al. | 427/96 |
| 5,378,408 A | 1/1995 | Carroll et al. | 252/514 |
| 5,378,508 A | 1/1995 | Castro et al. | 427/556 |
| 5,384,953 A | 1/1995 | Economikos et al. | 29/846 |
| 5,395,452 A | 3/1995 | Kobayashi et al. | 118/715 |
| 5,403,375 A | 4/1995 | Konig et al. | 75/255 |
| 5,421,926 A | 6/1995 | Yokinobu et al. | 156/83 |
| 5,433,893 A | 7/1995 | Jost et al. | 252/514 |
| 5,444,453 A | 8/1995 | Lalezari | 343/700 |
| 5,463,057 A | 10/1995 | Graetzel et al. | 546/4 |
| 5,494,550 A | 2/1996 | Benge | 156/268 |
| 5,501,150 A | 3/1996 | Leenders et al. | 101/466 |
| 5,539,041 A | 7/1996 | Arnold et al. | 524/494 |
| 5,559,057 A | 9/1996 | Goldstein | 437/228 |
| 5,565,143 A | 10/1996 | Chan | 252/514 |
| 5,571,311 A | 11/1996 | Belmont et al. | |
| 5,587,111 A | 12/1996 | Watanabe et al. | 252/514 |
| 5,599,046 A | 2/1997 | Behm et al. | 283/83 |
| 5,601,638 A | 2/1997 | Fukuda et al. | 106/19 |
| 5,604,027 A | 2/1997 | Sheridon | 428/323 |
| 5,604,673 A | 2/1997 | Washburn et al. | 363/147 |
| 5,645,932 A | 7/1997 | Uchibori | 428/347 |
| 5,665,472 A | 9/1997 | Tanaka et al. | 428/402 |
| 5,679,724 A | 10/1997 | Sacripante et al. | 523/161 |
| 5,712,673 A | 1/1998 | Hayashi et al. | 347/217 |
| 5,716,663 A | 2/1998 | Capote et al. | 427/96 |
| 5,725,647 A | 3/1998 | Carlson et al. | 106/31.86 |
| 5,725,672 A | 3/1998 | Schmitt et al. | 118/715 |
| 5,746,868 A | 5/1998 | Abe | 156/247 |
| 5,747,222 A | 5/1998 | Ryu | 430/312 |
| 5,747,562 A | 5/1998 | Mahmud et al. | |
| 5,750,194 A | 5/1998 | Watanabe et al. | 427/216 |
| 5,751,325 A | 5/1998 | Leenders et al. | 347/96 |
| 5,759,230 A | 6/1998 | Chow et al. | |
| 5,759,712 A | 6/1998 | Hockaday | 429/30 |
| 5,767,810 A | 6/1998 | Hagiwara et al. | 343/700 |
| 5,781,158 A | 7/1998 | Ko et al. | 343/700 |
| 5,801,108 A | 9/1998 | Huang et al. | 501/32 |
| 5,826,329 A | 10/1998 | Roth | 29/846 |
| 5,828,271 A | 10/1998 | Stitzer | 333/24.1 |
| 5,834,705 A * | 11/1998 | Jonaidi | 174/261 |
| 5,837,041 A | 11/1998 | Bean et al. | 106/31.6 |
| 5,837,045 A | 11/1998 | Johnson et al. | 106/31.85 |
| 5,838,271 A | 11/1998 | Park | 341/144 |
| 5,838,567 A | 11/1998 | Boggio, Jr. | |
| 5,846,615 A | 12/1998 | Sharma et al. | 427/597 |
| 5,853,470 A | 12/1998 | Martin et al. | 106/31.86 |
| 5,879,715 A | 3/1999 | Higgins et al. | 424/489 |
| 5,882,722 A | 3/1999 | Kydd | 427/123 |
| 5,894,038 A | 4/1999 | Sharma et al. | 427/554 |
| 5,909,083 A | 6/1999 | Asano et al. | 313/584 |
| 5,930,026 A | 7/1999 | Jacobson et al. | 359/296 |
| 5,932,280 A | 8/1999 | Roth | 427/102 |
| 5,953,037 A | 9/1999 | Hayashi et al. | 347/172 |
| 5,962,085 A | 10/1999 | Hayashi et al. | 427/585 |
| 5,966,580 A | 10/1999 | Watanabe et al. | 419/9 |
| 5,992,320 A | 11/1999 | Kosaka et al. | 101/401.1 |
| 5,997,044 A | 12/1999 | Behm et al. | 283/83 |
| 5,998,085 A | 12/1999 | Isberg et al. | 430/200 |
| 6,019,926 A | 2/2000 | Southward et al. | 264/216 |
| 6,025,026 A | 2/2000 | Smith et al. | 427/316 |
| 6,027,762 A | 2/2000 | Tomita et al. | 427/96 |
| 6,036,889 A | 3/2000 | Kydd | 252/512 |
| 6,042,643 A | 3/2000 | Belmont et al. | |
| 6,074,725 A | 6/2000 | Kennedy | 428/188 |
| 6,080,261 A | 6/2000 | Popat et al. | 156/240 |
| 6,099,897 A | 8/2000 | Sayo et al. | 427/180 |

| | | | | | | |
|---|---|---|---|---|---|---|
| 6,103,393 | A | 8/2000 | Kodas et al. ............... 428/570 | 6,939,576 B2 | 9/2005 | Deshpande et al. ......... 427/223 |
| 6,103,868 | A | 8/2000 | Heath et al. ............... 528/482 | 6,951,666 B2 | 10/2005 | Kodas et al. ............. 427/376.6 |
| 6,109,175 | A | 8/2000 | Kinoshita ................... 101/170 | 2001/0004477 A1 | 6/2001 | Fukunaga et al. ........... 427/475 |
| 6,118,426 | A | 9/2000 | Albert et al. | 2001/0017085 A1 | 8/2001 | Kubo et al. |
| 6,124,851 | A | 9/2000 | Jacobson ..................... 345/206 | 2002/0006723 A1 | 1/2002 | Goldstein ................... 438/660 |
| 6,133,147 | A | 10/2000 | Rhee et al. ................. 438/677 | 2002/0018861 A1 | 2/2002 | Hill et al. .................... 427/532 |
| 6,143,356 | A | 11/2000 | Jablonski ..................... 427/96 | 2002/0020491 A1 | 2/2002 | Price et al. ................ 156/307.1 |
| 6,153,348 | A | 11/2000 | Kydd et al. ................. 430/119 | 2002/0058143 A1 | 5/2002 | Hunt et al. .................. 428/412 |
| 6,156,837 | A | 12/2000 | Branan, Jr. et al. | 2002/0079832 A1 | 6/2002 | Van Tongeren et al. ..... 313/504 |
| 6,169,129 | B1 | 1/2001 | Mahmud et al. | 2002/0131254 A1 | 9/2002 | Schaper ...................... 361/760 |
| 6,169,837 | B1 | 1/2001 | Kato et al. | 2002/0148640 A1 | 10/2002 | Holl et al. ................... 174/256 |
| 6,177,151 | B1 | 1/2001 | Chrisey et al. .............. 427/596 | 2002/0150678 A1 | 10/2002 | Cramer et al. .............. 427/212 |
| 6,190,731 | B1 | 2/2001 | Tecle ....................... 427/213.3 | 2002/0151161 A1 | 10/2002 | Furusawa |
| 6,197,147 | B1 | 3/2001 | Bonsel et al. ............... 156/269 | 2002/0176987 A1 | 11/2002 | Yadav et al. ................. 428/402 |
| 6,197,366 | B1 | 3/2001 | Takamatsu .................. 427/125 | 2003/0009726 A1 | 1/2003 | Chang et al. |
| 6,200,405 | B1 | 3/2001 | Nakazawa et al. .......... 156/248 | 2003/0020768 A1 | 1/2003 | Renn ............................ 347/2 |
| 6,207,268 | B1 | 3/2001 | Kosaka et al. ............... 428/325 | 2003/0060038 A1 | 3/2003 | Sirringhaus et al. |
| 6,214,259 | B1 | 4/2001 | Oda et al. .................... 252/500 | 2003/0063155 A1 | 4/2003 | Nakao et al. .................. 347/44 |
| 6,214,520 | B1 | 4/2001 | Wolk et al. ................ 430/273.1 | 2003/0070569 A1 | 4/2003 | Bulthaup et al. ............ 101/127 |
| 6,238,734 | B1 | 5/2001 | Senzaki et al. .............. 427/226 | 2003/0070747 A1 | 4/2003 | Kydd .......................... 156/233 |
| 6,245,494 | B1 | 6/2001 | Andriessen et al. ......... 430/346 | 2003/0073042 A1 | 4/2003 | Cernigliaro et al. ......... 430/321 |
| 6,251,471 | B1 | 6/2001 | Granoff et al. ................ 427/97 | 2003/0082485 A1 | 5/2003 | Bulthaup et al. ............ 430/312 |
| 6,251,488 | B1 | 6/2001 | Miller et al. ................. 427/596 | 2003/0083203 A1 | 5/2003 | Hashimoto et al. |
| 6,270,389 | B1 | 8/2001 | Kobayashi et al. ........... 445/24 | 2003/0085057 A1 | 5/2003 | Hashimoto |
| 6,274,412 | B1 | 8/2001 | Kydd et al. ................. 438/149 | 2003/0096056 A1 | 5/2003 | Kawamura et al. ........... 427/66 |
| 6,277,740 | B1 | 8/2001 | Goldstein ................... 438/660 | 2003/0102099 A1 | 6/2003 | Yadav et al. ................. 162/208 |
| 6,294,401 | B1 | 9/2001 | Jacobson et al. .............. 438/99 | 2003/0108664 A1 | 6/2003 | Kodas et al. |
| 6,296,896 | B1 | 10/2001 | Takahashi et al. ............. 427/77 | 2003/0110978 A1 | 6/2003 | Abe et al. ................. 106/31.13 |
| 6,317,023 | B1 | 11/2001 | Felten ......................... 338/254 | 2003/0116057 A1 | 6/2003 | Suzuki et al. ............. 106/31.33 |
| 6,323,096 | B1 | 11/2001 | Saia et al. ................... 438/384 | 2003/0123259 A1 | 7/2003 | Furuya et al. ................ 362/489 |
| 6,328,894 | B1 | 12/2001 | Chan et al. ................... 210/638 | 2003/0124259 A1 | 7/2003 | Kodas et al. ............. 427/376.6 |
| 6,329,899 | B1 | 12/2001 | Hunt et al. ................... 338/308 | 2003/0145680 A1 | 8/2003 | Ichida ........................ 75/252 |
| 6,338,809 | B1 | 1/2002 | Hampden-Smith et al. ..... 264/7 | 2003/0146019 A1 | 8/2003 | Hirai |
| 6,348,295 | B1 | 2/2002 | Griffith et al. ............... 430/198 | 2003/0148024 A1 | 8/2003 | Kodas et al. ................. 427/125 |
| 6,356,234 | B1 | 3/2002 | Harrison et al. | 2003/0151030 A1 | 8/2003 | Gurin ......................... 252/502 |
| 6,358,567 | B2 | 3/2002 | Pham et al. .................. 427/421 | 2003/0161959 A1 | 8/2003 | Kodas et al. ............. 427/376.2 |
| 6,358,611 | B1 | 3/2002 | Nagasawa et al. ........... 428/403 | 2003/0168639 A1 | 9/2003 | Cheon et al. ................ 252/500 |
| 6,368,378 | B2 | 4/2002 | Sasaki .......................... 75/252 | 2003/0175411 A1 | 9/2003 | Kodas et al. ................. 427/58 |
| 6,372,158 | B1 | 4/2002 | Hashimoto et al. .......... 252/513 | 2003/0180451 A1 | 9/2003 | Kodas et al. ................. 427/123 |
| 6,379,742 | B1 | 4/2002 | Behm et al. .................... 427/7 | 2003/0183165 A1 | 10/2003 | Kakimoto et al. ............ 118/35 |
| 6,379,745 | B1 | 4/2002 | Kydd et al. .................... 427/96 | 2003/0185739 A1 | 10/2003 | Mangold et al. |
| 6,380,778 | B2 | 4/2002 | Uehara et al. ............... 327/175 | 2003/0185889 A1 | 10/2003 | Yan et al. .................... 424/484 |
| 6,395,053 | B1 | 5/2002 | Fau et al. ..................... 75/362 | 2003/0201244 A1 | 10/2003 | Ogawa et al. |
| 6,399,230 | B1 | 6/2002 | Tormey et al. ............... 428/702 | 2003/0207949 A1 | 11/2003 | Klabunde et al. .............. 516/9 |
| 6,416,150 | B1 | 7/2002 | Kimura ......................... 347/14 | 2003/0211246 A1 | 11/2003 | Kydd et al. .................. 427/282 |
| 6,458,327 | B1 | 10/2002 | Vossmeyer ................. 422/68.1 | 2003/0213614 A1 | 11/2003 | Furusawa et al. |
| 6,458,431 | B2 | 10/2002 | Hill et al. .................... 427/537 | 2003/0215565 A1 | 11/2003 | Chang et al. |
| 6,467,897 | B1 | 10/2002 | Wu et al. ..................... 347/102 | 2003/0224104 A1 | 12/2003 | Fukunaga et al. |
| 6,487,774 | B1 | 12/2002 | Nakao et al. ................ 29/890.1 | 2003/0228748 A1 | 12/2003 | Nelson et al. |
| 6,501,663 | B1 | 12/2002 | Pan | 2004/0004209 A1 | 1/2004 | Matsuba et al. .......... 252/518.1 |
| 6,503,831 | B2 | 1/2003 | Speakman ................... 438/674 | 2004/0030019 A1 | 2/2004 | Kim et al. .................... 524/431 |
| 6,537,359 | B1 | 3/2003 | Spa .......................... 106/31.92 | 2004/0038808 A1 | 2/2004 | Hampden-Smith et al. |
| 6,541,433 | B2 | 4/2003 | Schultz et al. ............... 510/152 | 2004/0043691 A1 | 3/2004 | Abe et al. ...................... 445/24 |
| 6,548,036 | B2 | 4/2003 | Iida et al. | 2004/0058457 A1 | 3/2004 | Huang et al. ................ 436/524 |
| 6,555,015 | B1 * | 4/2003 | Dailey et al. .................. 216/17 | 2004/0074336 A1 | 4/2004 | Daimon et al. |
| 6,599,631 | B2 | 7/2003 | Kambe et al. ................ 428/447 | 2004/0126708 A1 | 7/2004 | Jing et al. |
| 6,645,569 | B2 | 11/2003 | Cramer et al. ............... 427/466 | 2004/0140549 A1 | 7/2004 | Miyagawa |
| 6,649,138 | B2 | 11/2003 | Adams et al. ................ 423/407 | 2004/0142145 A1 | 7/2004 | Fujii et al. |
| 6,660,680 | B1 | 12/2003 | Hampden-Smith et al. .. 502/180 | 2004/0144958 A1 | 7/2004 | Conaghan et al. ........... 252/500 |
| 6,667,360 | B1 | 12/2003 | Ng et al. ..................... 524/492 | 2004/0144959 A1 | 7/2004 | Conaghan et al. ........... 252/500 |
| 6,713,389 | B2 | 3/2004 | Speakman ................... 438/674 | 2004/0145858 A1 | 7/2004 | Sakurada |
| 6,730,400 | B1 | 5/2004 | Komatsu et al. ............. 428/403 | 2004/0151893 A1 | 8/2004 | Kydd et al. .................. 428/323 |
| 6,743,319 | B2 | 6/2004 | Kydd ........................... 156/230 | 2004/0160465 A1 | 8/2004 | Baker-Smith et al. |
| 6,753,108 | B1 | 6/2004 | Hampden-Smith et al. .... 429/44 | 2004/0173144 A1 | 9/2004 | Edwards et al. |
| 6,773,614 | B2 | 8/2004 | Field ............................ 216/5 | 2004/0182533 A1 | 9/2004 | Blum et al. |
| 6,774,036 | B2 | 8/2004 | Goldstein ................... 438/660 | 2004/0191695 A1 | 9/2004 | Ray et al. |
| 6,780,765 | B2 | 8/2004 | Goldstein ................... 438/660 | 2004/0196329 A1 | 10/2004 | Ready et al. |
| 6,811,885 | B1 | 11/2004 | Andriessen et al. ......... 428/464 | 2004/0201648 A1 | 10/2004 | Sekiya |
| 6,827,772 | B2 | 12/2004 | Foster | 2004/0206941 A1 | 10/2004 | Gurin ......................... 252/500 |
| 6,830,778 | B1 | 12/2004 | Schulz et al. ............... 427/123 | 2004/0223926 A1 | 11/2004 | Kobayashi |
| 6,855,196 | B2 | 2/2005 | Kawamura et al. ......... 106/31.6 | 2004/0231594 A1 | 11/2004 | Edwards et al. |
| 6,880,909 | B2 | 4/2005 | King et al. .................... 347/19 | 2004/0239730 A1 | 12/2004 | Kurosawa |
| 6,881,239 | B2 | 4/2005 | Uchida ......................... 75/252 | 2004/0247842 A1 | 12/2004 | Koyama et al. |

| | | | | | | | |
|---|---|---|---|---|---|---|---|
| 2004/0250750 | A1 | 12/2004 | Reda et al. .................... 117/84 | WO | WO 03/035279 | A1 | 5/2003 |
| 2004/0261700 | A1 | 12/2004 | Edwards et al. | WO | WO 03/038002 | A1 | 5/2003 |
| 2004/0263564 | A1 | 12/2004 | Maekawa et al. | WO | WO 03/051562 | A1 | 6/2003 |
| 2004/0265549 | A1 | 12/2004 | Kydd ......................... 428/201 | WO | WO 03/106573 | A1 | 12/2003 |
| 2005/0009230 | A1 | 1/2005 | Hasei | WO | WO 2004/027787 | A1 | 4/2004 |
| 2005/0037614 | A1 | 2/2005 | Fukuchi | WO | WO 2004/030072 | A1 | 4/2004 |
| 2005/0056118 | A1 | 3/2005 | Xia et al. | WO | WO 2004/050260 | A3 | 6/2004 |
| 2005/0078158 | A1 | 4/2005 | Magdassi et al. ............ 347/100 | WO | WO 2004/050350 | A1 | 6/2004 |
| 2005/0116203 | A1 | 6/2005 | Takahashi et al. ........... 252/500 | WO | WO 2004/062890 | A2 | 7/2004 |
| 2005/0207930 | A1 | 9/2005 | Yamaguchi | WO | WO 2004/063295 | A1 | 7/2004 |
| 2005/0238804 | A1 | 10/2005 | Garbar et al. | WO | WO 2004/068918 | A3 | 8/2004 |
| 2006/0001726 | A1 | 1/2006 | Kodas et al. | WO | WO 2004/078641 | A1 | 9/2004 |
| 2006/0047014 | A1 | 3/2006 | Hopper et al. | WO | WO 2004/104153 | A1 | 12/2004 |
| 2006/0083694 | A1 | 4/2006 | Kodas et al. | WO | WO 2004/105985 | A1 | 12/2004 |
| 2006/0158497 | A1 | 7/2006 | Vanheusden et al. | WO | WO 2005/044451 | A1 | 5/2005 |
| 2006/0159603 | A1 | 7/2006 | Vanheusden et al. | | | | |
| 2006/0162497 | A1 | 7/2006 | Kodas et al. | | | | |
| 2006/0163744 | A1 | 7/2006 | Vanheusden et al. | | | | |
| 2006/0165898 | A1 | 7/2006 | Kodas et al. | | | | |
| 2006/0165910 | A1 | 7/2006 | Kodas et al. | | | | |
| 2006/0166057 | A1 | 7/2006 | Kodas et al. | | | | |
| 2006/0176350 | A1 | 8/2006 | Howarth et al. | | | | |

FOREIGN PATENT DOCUMENTS

| | | |
|---|---|---|
| EP | 0 449 309 B9 | 3/1991 |
| EP | 0 537 502 B1 | 9/1992 |
| EP | 0 641 670 B1 | 8/1994 |
| EP | 0 696 515 B1 | 5/1995 |
| EP | 0 930 641 A3 | 1/1999 |
| EP | 0 995 718 B1 | 9/1999 |
| EP | 0 977 212 A2 | 2/2000 |
| EP | 0 982 090 A1 | 3/2000 |
| EP | 1 083 578 A1 | 3/2001 |
| EP | 1 107 298 A2 | 6/2001 |
| EP | 1 302 895 A3 | 4/2002 |
| EP | 1 335 393 A1 | 4/2002 |
| EP | 0 995 718 B1 | 11/2002 |
| EP | 1 493 780 A1 | 4/2003 |
| EP | 1 323 793 A1 | 7/2003 |
| EP | 1 340 568 A1 | 9/2003 |
| EP | 1 342 760 A1 | 9/2003 |
| EP | 1 544 905 A1 | 9/2003 |
| EP | 1 515 348 A2 | 3/2005 |
| JP | 62-113164 | 5/1987 |
| JP | 01-303787 | 7/1989 |
| JP | 2002-124016 | 5/1990 |
| JP | 2000-011875 | 1/2000 |
| JP | 2000-182889 | 6/2000 |
| JP | 2004-311725 | 4/2004 |
| JP | 2005-191059 | 7/2005 |
| JP | 2005-219873 | 8/2005 |
| WO | WO 89/05567 | 6/1989 |
| WO | WO 97/48257 | 12/1997 |
| WO | WO 98/37133 A1 | 8/1998 |
| WO | WO 99/16556 A1 | 4/1999 |
| WO | WO 99/16601 A1 | 4/1999 |
| WO | WO 99/17351 A1 | 4/1999 |
| WO | WO 99/61911 | 12/1999 |
| WO | WO 00/10197 A1 | 2/2000 |
| WO | WO 00/10736 | 3/2000 |
| WO | WO 00/29208 A1 | 5/2000 |
| WO | WO 00/69235 A1 | 11/2000 |
| WO | WO 00/72224 A1 | 11/2000 |
| WO | WO 01/54203 A2 | 7/2001 |
| WO | WO/01/56736 A2 | 8/2001 |
| WO | WO 01/82315 A1 | 11/2001 |
| WO | WO 01/87503 A1 | 11/2001 |
| WO | WO 02/04698 A2 | 1/2002 |
| WO | WO 02/05294 A1 | 1/2002 |
| WO | WO 02/098576 A1 | 12/2002 |
| WO | WO 03/018645 A1 | 3/2003 |
| WO | WO 03/032084 A2 | 4/2003 |

OTHER PUBLICATIONS

All-Polymer Thin Film Transistor Fabricated by High-Resolution Ink-jet Printing, Shimoda, T., et al., "IEEE International Solid-State Circuits Conference" Session. 16 (2004).

Custom Color Liquid Development (LID) Process, Goodman, N.B., "Xerox Disclosure Journal" vol. 21, No. 2, pp. 157 (1996).

Ink Jet color Copier and Universal Printer, Pearson R.C., et al., "IBM Technical Disclosure Bulletin" vol. 16, No. 1, pp. 144-145 (1973).

Pending U.S. Appl. No. 11/331,237, entitled "Ink-Jet Printing of Compositionally Non-Uniform Features", filed Jan. 13, 2006.

Pending U.S. Appl. No. 11/331,185 entitled "Controlling Ink Migration During the Formation of Printable Electronic Features", filed Jan. 13, 2006.

Pending U.S. Appl. No. 11/331,186, entitled "Replacement of Passive Electrical Components", filed Jan. 13, 2006.

Pending U.S. Appl. No. 11/331,239, entitled "Processes for Planarizing Substrates and Encapsulating Printable Electronic Features", filed Jan. 13, 2006.

Pending U.S. Appl. No. 11/331,187, entitled "Optimized Multi-Layer Printing of Electronics and Displays", filed Jan. 13, 2006.

Pending U.S. Appl. No. 11/331,189, entitled "A System and Process for Manufacturing Application Specific Printable Circuits (ASPC's) and Other Custom Electronic Devices", filed Jan. 13, 2006.

Inkjet Printing of Nanosized Silver Colloids, Lee, H-H. et al., "Nanotechnology" 16, pp. 2436-2441 (2005).

Monolayer-Protected Clusters: Molecular Precursors to Metal Films, Wuelfing, P.W. et al., "American Chemical Society" vol. 13, No. 1, pp. 87-95 (2001).

Oligomeric Ketoester Precursors For Improved Polyimide Planarization and Gapfilling; "IBM Technical Disclosure Bulletin", vol. 30, No. 1, pp. 343-346 (1987).

Porosity-Grain Growth Relationships in the Sintering of Nanocrystalline Ceramics, Mayo, M.J. et al., "Nanostructured Materials" vol. 3, pp. 43-52 (1993).

Smoothing of Irregular SiO2 Surfaces, Spencer, O.S., "IBM Technical Disclosure Bulletin" vol. 20, No. 11B, pp. 4842-4843 (1978).

Blum, A.E., et al., "Measurement of Clay Surface Areas By Polyvinylpyrrolidone (PVP) Sorption and Its Use For Quantifying Illite and Smectite Abundance", *Clays and Clay Minerals*, vol. 52, No. 5, pp. 589-602 (2004).

Carotenuto, G., et al., "A Qualitative Model for the Growth Mechanism of Silver Clusters in Polymer Solution", *The European Physical Journal B*, pp. 437-441 (2001).

Fievet, F., et al., "Preparing Monodisperse Metal Powders I Micrometer and Submicrometer Sizes by the Polyol Process", *MRS Bulletin*, Dec. 1989.

Lee, H.K., et al., "One-step preparation of ultrafine poly(acrylonitrile) fibers containing silver nanoparticles", *Material Letters*, 59, pp. 2977-2980 (2005).

Xia, Y., et al., "Shape-Controlled Synthesis of Metal Nanostructures: The Case of Silver", *Chemistry, A European Journal*, 11, pp. 454-463 (2005).

Advanced Materials Systems for Ultra-Low-Temperature, Digital, Direct-Write Technologies, Digital, Direct Write Technologies, Vanheusden, et al., "Direct-Write Technologies for Rapid Prototyping Applications", pp. 123-173 (2001).

Dispersion and Stability of Silver Inks, Tay, et al., "Journal of Materials Science" vol. 37, pp. 4653-4661 (2002).

Ethylene Glycol-Mediated Synthesis of Metal Oxide Nanowires, X. Jiang, Y. Wang, T. Herricks, Y. Xia, "Journal of Materials Chemistry" 14, 695-703 (2004).

Fine Line Conductor Manufacturing Using Drop-On-Demand PZT Printing Technology, Szczech, et al. "IEEE Transactions on Electronics Packaging Manufacturing" vol. 25, No. 1 (2002).

Gold and Silve Nanoparticles: A Class of Chromophores with Colors Tunable in the Range from 400 to 750 nm, Y. Sun, Y. Xia, "The Analyst, The Royal Scoiety of Chemistry" 128, 686-691 (2003).

Ink Jet Printing of Hybrid Circuits, R.W. Vest, Tweedell and B.C. Buchanan, "Hybrid Microelectronics" 6, 261, 267 (1983).

Ink-Jet Printed Nanoparticle Microelectromechanical Systems, Fuller, et al., "Journal of Microelectromechanical Systems" vol. 11, No. 1 (2002).

Ink-Jet Printing of Catalyst Patterns for Electroless Metal Deposition, Shah, et al., "American Chemical Society" 15, 1584-1587 (1999).

Large-Scale Synthesis of Monodispers Nanorods of Se/Te Alloys Through A Homogeneous Nucleation and Solution Growth Process, B. Mayers, B. Gates, Y. Yin, Y. Xia, "Advanced Materials" 13, No. 18 (2001).

Large-Scale Synthesis of Silver Nanocubes: The Role of HICI in Promoting Cube Perfection and Monodispersity, S.H. Im, Y.T. Lee, B. Wiley, Y. Xia "Angewandte Chemical International Edition" 44, 2154-2157 (2005).

Large-Scale Synthesis of Uniform Nanowires through a Soft, Self-Seeding, Polyol Process "Advanced Materials" 14, No. 11 (2002).

Late-News Paper: Inkjet-Printed Bus and Address Electrodes For Plasma Display, Furusawa, et al., "SID 02 Digest" pp. 753-755 (2002).

Liquid Ink Jet Printing With MOD Inks for Hybrid Microcircuits, K.F. Teng, R.W. Vest "IEEE Transaction on Components, Hybrids and Manufacturing Technology" vol. CHMT-12, No. 4, 545-549 (1987).

Materials, Silver Ink for Jet Printing "NASA Tech Briefs" Aug. 1989.

Microwave-polyol Process for Metal Nanophases, S. Komarneni, H. Katsuki, D. Li, A.S. Bhalla "Journal of Physics, Condensed Matter" 16, S1305-S1312 (2004).

New Development of Nonlinear Optical Crystals for the Ultraviolet Region with Molecular Engineering Approach, C. Chen, Y. Wang, Y. Xia, B. Wu, D. Tang, K. Wu, Z. Wenrong, L. Yu, L. Mei "Journal of Applied Physics" 77, (6) 1995).

New Nonlinear Optical Crystals for UV and VUV Harmonic Generation, Y. Xia, C. Chen, D. Tang, B Wu Advanced Materials: 7, No. 1 (1995).

Physical Mechanisms Governing Pattern Fidelity in Microscale Offset Printing, Darhuber, et al. "Journal of Applied Physics", vol. 90, No. 7, pp. 3602-3609 (2001).

Polyol Synthesis of Uniform Silver Nanowires: A Plausible Growth Mechanism and the Supporting Evidence, Y. Sun, B Mayers, T. Herricks, Y. Xia "Nano Letters" vol. 3, No. 7, 955-960 (2003).

Polyol Synthesis of Silver Nanoparticles: Use of Choloride and Oxygen to Promote the Formation of Single-Crystal, Truncated Cubes and Tetrahedrons, B. Wiley, T. Herricks, Y. Sun, Y. Xia "Nano Letters" vol. 4, No. 9, 1733-1739 (2004).

Polyol Synthesis of Platinum Nanoparticles: Control of Morphology with Sodium Nitrate, T. Herricks, J. Chen, Y. Xia "Nano Letters" vol. 4, No. 12, 2367-2371 (2004).

Polyol Synthesis of Platinum Nanostructures: Control of Morphology Through the Manipulation of Reduction Kinetics, J. Chen, T. Herricks, Y. Xia "Angewandte Chemical International Edition" 44, 2589-2592 (2005).

Polyol Synthesis of Silver Nanostructures: Control of Product Morphology with Fe(II) or Fe(III) Species, B. Wiley, Y. Sun, Y. Xia "Langmuir The ACS Journal of Surfaces and Colloids" Vo 21, No. 18 (2005).

Preparation and Characterization of Nano-Sized Ag/PVP Composites for Optical Applications, G Carotenuto, G.P. Pepe, L. Nicolais "The European Physical Journal B" 16, 11-17 (2000).

Preparation of Colloidal Silver Dispersions By The Polyol Process Part 1—Synthesis and Characterization, P.Y. Silvert, R. Herrera-Urbina, N. Duvauchelle, V. Vijayakrishan, K. Tekaia-Elhsissen "Journal of Materials Chemistry" 6(4), 573-577 (1996).

Preparation of Colloidal Silver Dispersions By The Polyol Process Part 2—Mechanism of Particle Formation, P.-Y. Silvert, R. Herrera-Urbina, K. Tekaia-Elhsissen "Journal of Materials Chemistry" 7(2), 293-299 (1997).

Preparation of Gold, Platinum, Palladium and Silver Nanoparticles by the Reduction of their Salts with a Weak Reductant-Potassium Bitartrate, Y. Tan, X. Dai, Y. Li, D. Zhu "Journal of Materials Chemistry" 13, 1069-1075 (2003).

Preparation of Polychrome Silver Nanoparticles in Different Solvents, R. He, X. Qian, J. Yin, Z. Zhu "Journal of Materials Chemistry" 12, 3783-3786 (2002).

PVP Protective Mechanism of Ultrafine Silve Powder Synthesized by Chemical Reduction Processes, Z. Zhang, B. Zhao, L. Hu "Journal of Solid State Chemistry" 121, 105-110, Article No. 0015 (1996).

Shape-Controlled Synthesis of Gold and Silver Nanoparticles, Y. Sun, Y. Xia "Science Magazine" vol. 298, pp. 2176-2179 (2002).

Shape-Controlled Synthesis of Silver and Gold Nanostructures, B. Wiley, Y. Sun, J. Chen, H. Cang, Z.Y. Li, X. Li, Y. Xia "MRS Bulletin" vol. 30 (2005).

Silver Nanowires Can Be Directly Coated with Amorphous Silica to Generate Well-Controlled Coaxial Nanocables of Silver/Silica, Y. Yin, Y. Lu, Y. Sun, Y. Xia "Nano Letters" vol. 2, No. 4, 427-430 (2002).

Site Selective Copper and Silver Electroless Metallization Facilitated by a Photolithographically Patterned Hydrogen Silsesquioxane Mediated Seed Layer, Harness, et al. "American Chemical Society", 2002.

Snythesis of Monodisperse Au, Pt, Pd, Ru and Ir Nanoparticles in Ethylene Glycol, F.Bonet, V. Delmas, S. Grugeon, R. Herrera Urbina, P.-Y. Silvert, K. Tekaia-Elhsissen "NanoStructured Materials" vol. 11, No. 8, pp. 1277-1284 (1999).

Synthesis of Monodisperse Submicronic Gold Particles by the Polyol Process, P.-Y. Silvert, K. Tekaia-Elhsissen "Solid State Ionics" 82, 53-60 (1995).

Tape Compositions For The Deposition of Electronic Features, T. Kodas, U.S. Appl. No. 10/274,495 (Oct. 18, 2002).

Transformation of Silver Nanospheres into Nanobelt and Triangular Nanoplates Through a Thermal Process, Y. Sun, B. Mayers, Y. Xia "Nano Letters" vol. 3, No. 5, 675-679 (2003).

Triangular Nanoplates of Silver: Synthesis, Characterization, and Use as Sacrificial Templates for Generating Triangular Nanorings of Gold, Y. Sun, Y. Xia "Advanced Materials" 15, No. 9 (2003).

Uniform Silver Nanowires Synthesis by Reducing AgNO3 with Ethylene Glycol in the Presence of Seeds and Poly(Vinyl Pyrrolidone), Y. Sun, Y. Yin, B.T. Mayers, T. Herricks, Y. Xia "Chemical Materials" 14, 4736-4745 (2002).

ITT Cuts Costs of PC Board Manufacturing, K. Dreyfack, "Electronics" vol. 52, No. 17 (1979).

(2005) "How Printable Computers Will Work", Worldwide Web Reference Source, http://computer.howstuffworks.com/printable-computer.htm/printable Date Retrieved: May 23, 2005.

(2005) "Definiitions of inkjet printer on the Web:", Worldwide Web Reference Source, http://www.google.com/search?hl=en&lr=&oi+defmore&q=define:inkjet+printer Date Retrieved: May 23, 2005.

(2005) "Screen Printing Technology, Principles of Screen-printing", Worldwide Web Reference Source, http://www.spauk.co.uk/TechnicalPages/Screen%20TP.pdf Date Retrieved: May 3, 2006.

(Unknown) "Lithography—definition of Lithography in Encyclopedia", Worldwide Web Reference Source, http://encyclopedia.laborlawtalk.com/Lithography Date Retrieved: May, 25, 2005.

(2006) "Photolithography: Definition and Much More from Answers.com", Worldwide Web Reference Source, http://www.answers.com/topic/photolithography Date Retrieved: May, 25, 2005.

(Dec. 3, 2002) "Printing Drawings and Photographic Images", Worldwide Web Reference Source, http://histclo.hispeed.com/photo/photo-print.html Date Retrieved: May 25, 2005.

(Apr. 5, 2006) "Photolithography", Worlwide Web Reference Source, http://www.ece.gatech.edu/research/labs/vc/theory/photolith.html Date Retrieved: May 25, 2005.

Measurement of Clay Surface Areas by Polyvinylpyrrolidone (PVP) Sorption and Its Use for Quantifying Illite and Smectite Abundance, A.E. Blum, D.D. Eberl,"Clays and Clay Mineals", vol. 52, No. 5, 589-602 (2004).

Metal Nanoparticle Compositions, Vanheusden, et al. U.S. Appl. No. 11/331,211, filed Jan. 13, 2006.

Separation of Metal Nanoparticles, Vanheusden, et al. U.S. Appl. No. 11/331,238, filed Jan. 13, 2006.

Production of Metal Nanoparticles, Vanheusden, et al. U.S. Appl. No. 11/331,230, filed Jan. 13, 2006.

Printable Electronic Conductors, Vanheusden, et al. U.S. Appl. No. 11/231,230, filed Jan. 13, 2006.

Replacement of Passive Electrical Components, Howarth, et al. U.S. Appl. No. 11/331,186, filed Jan. 13, 2006.

Circuit Modeling and Selective Deposition, Howarth, et al. U.S. Appl. No. 11/331,188, filed Jan. 13, 2006.

Ink-Jet Printing of Compositionally Non-Uniform Features, Vanheusden, et al. U.S. Appl. No. 11/331,237, Jan. 13, 2006.

Printable Electronic Features on Non-Uniform Substrate and Processes for Making Same, Vanheusden, et al., U.S. Appl. No. 11/331,190, filed Jan. 13, 2006.

Controlling Ink Migration During the Formation of Printable Electronic Features, Kowalski, et al., U.S. Appl. No. 11/331,185, filed Jan. 13, 2006.

Processes for Planarizing Substrates and Enapsulating Printable Electronic Features, Mark Kowalski, U.S. Appl. No. 11/331,239, Jan. 13, 2006.

Optimized Multi-Layer Printing of Electroics and Displays, Edwards, et al. U.S. Appl. No. 11/331/187, filed Jan. 13, 2006.

A System and Process for Manufacturing Application Specific Printable Circuits (ASPC's) and Other Custom Electronic Devices, Chuck Edwards, U.S. Appl. No. 11/331,189, filed Jan. 13, 2006.

A System and Process for Manufacturing Custom Electronics by Combining Traditional Electronics with Printable Electronics, Chuck Edwards, U.S. Appl. No. 11/331,191, filed Jan. 13, 2006.

Security Features, Their Use, and Processes for Making Them, Hampden-Smith, et al. U.S. Appl. No. 11/331,233, Jan. 13, 2006.

* cited by examiner

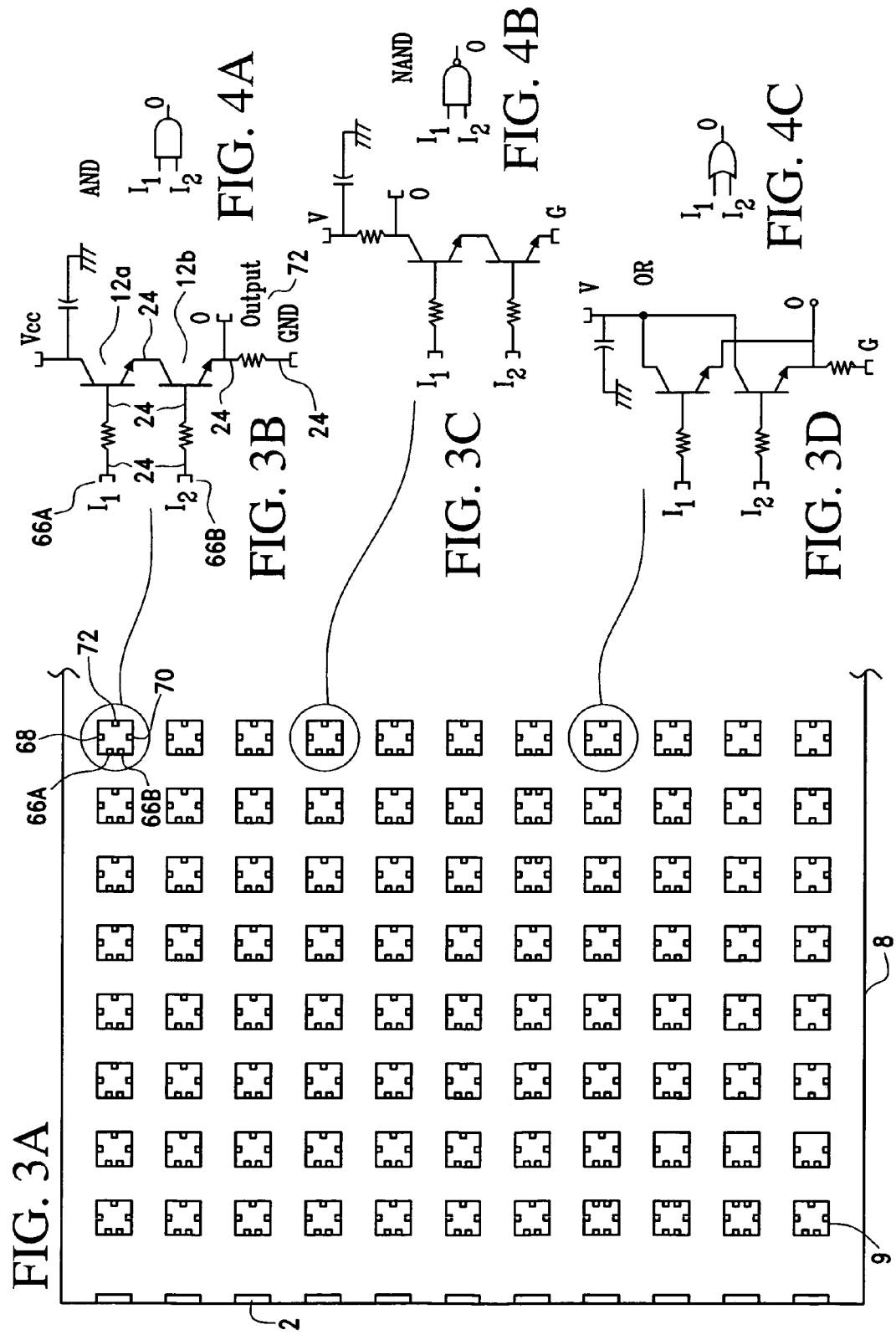

SYSTEM AND PROCESS FOR MANUFACTURING CUSTOM ELECTRONICS BY COMBINING TRADITIONAL ELECTRONICS WITH PRINTABLE ELECTRONICS

CROSS REFERENCE TO RELATED APPLICATIONS

This application claims the benefit of U.S. Provisional Patent Application Ser. Nos. 60/643,577; 60/643,629; and 60/643,578, all filed on Jan. 14, 2005, the entireties of which are all incorporated herein by reference.

BACKGROUND OF THE INVENTION

1. Field of the Invention

The invention relates to direct printing. More particularly, the invention relates to a system and process for direct printing using conductive particles in an ink solution for dispersion on substrates, particularly traditional technology substrates that contain pre-provided electronic circuits, to create one or more new custom electronic functions.

2. Background Art

Printable electronic inks, and other new "paper-like" display technologies such as E Ink, have developed as an advanced processes of producing electronics and displays on paper-like materials and films. These low cost electronics promise to dramatically reduce costs and increase the number and variety of applications for electronics and displays into markets which were previously considered too costly. The phrase "disposable electronics" will now come to describe these type of low costs products, and actually be realizable. Examples of such "disposable electronics" include intelligent medical packaging, RFID tags, smart cards, and the like.

The problem for many of these applications, however, is that the active devices needed to make them functional (transistors, display components, electronic memory, logic circuits, RFID and radio circuits, and others) often require high precision patterning techniques, clean room environments and other special processes that make them cost prohibitive for regional manufacturing using conventional printing equipment. There have been attempts in the prior art to try to overcome the costs prohibitions. For example, in the silicon industry, application specific integrated circuits (ASICs) were developed. These ASIC's were pre-patterned with transistor devices (very often with as many as 10,000 to hundreds of thousands of transistors). Often larger functional logic blocks (like a processor or memory circuit) were included and these devices were then called "standard cells." But, there was no practical way to combine the ASIC's and standard cells with printable electronic inks.

Ink jet (IJ) printing, screen printing and other printing techniques of silver ink and other conductors have been demonstrated. This is a relatively simple and standard process. IJ printing and more exotic patterning techniques have also been used to create transistors on flexible substrates as well. But to date, the printing of semiconductors and displays has required far more complex processes for either organic or inorganic semiconductor materials to be deposited and turned into a functional transistor or other logic devices. Making custom printed circuits on low cost substrates with these processes would therefore require the customer to have either a very complex and sophisticated process equipment with many layers patterned, or originate a custom design for each new device.

Furthermore, even with today's current printing techniques of ink jet printing, screen printing and other printing techniques of silver ink and other conductors, the ability to complete electronic circuits on previously partially fabricated printed circuit boards cannot be done. Manufacturers of printed circuit board devices, therefore, must painstakingly design and verify their designs for electronic circuits prior to manufacturing them on conventional printed circuit boards. The ability to make changes to the conventional printed circuit boards is extremely limited, time consuming, and therefore very expensive. Customizing the printed circuit boards once they have been manufactured and delivered practically impossible.

Still further, traditional electronics do not lend themselves to ready customization. To create new designs, as discussed above, takes a considerable amount of resources. It is very expensive and time consuming to modify or customize an existing electronic circuit on a traditional substrate. As a result, today's circuit manufacturers are failing to meet the needs of a substantial component of electronic manufacturers.

Thus, a need exists for printing on standard substrates that overcomes all of the above mentioned difficulties, as well as those not mentioned, and provide the advantages described in greater detail below.

SUMMARY OF THE INVENTION

It is therefore a general object of the invention to provide a non-contact direct printing system that will obviate or minimize problems of the type previously described.

It is a specific object of the present invention to provide a system and process for printing interconnections between pre-provided partially interconnected conventional integrated circuits that are included on a conventional or traditional printed circuit board such that the user of the system and process can easily and inexpensively modify and/or customize the electronic circuit to suit their own needs.

It is a further object of the present invention to provide a system and process for direct printing electronic devices that constitute one or more electronic functions on a standard printed circuit that includes pre-provided partially interconnected standard integrated circuits that are included on a conventional printed circuit board, and to further direct print customized interconnections between the existing pre-provided conventional integrated circuits and the newly directed printed electronic devices to create a custom printed circuit board with one or more custom electronic functions.

It is yet a further object of the present invention to provide a system and process for direct printing electronic devices that constitute one or more electronic functions on a standard printed circuit that includes pre-provided partially interconnected standard integrated circuits that are included on a conventional printed circuit board, and to further direct print customized interconnections between the existing pre-provided conventional integrated circuits and the newly directed printed electronic devices to create a custom printed circuit board with one or more custom electronic functions, and to further provide a process for attaching one or more smaller conventional printed circuit boards onto a larger conventional printed circuit board, and to direct print customized interconnections as well as custom electronic devices The above described disadvantages are overcome and a number of advantages are realized by the present invention which relates to a process for creating a custom printed circuit with one or more desired electronic functions comprising the steps of a) providing a set of conventional interconnected electronic devices on a substrate, b) designing an interconnection pattern between the set of interconnected electronic devices to create the one or more electronic functions, and c) direct printing the interconnection pattern to provide the custom printed circuit board with the one or more desired electronic functions.

According to still another embodiment of the present invention, a process for creating a custom printed circuit with one or more desired electronic functions is provided, comprising the steps of a) providing a master substrates pre-provided with one or more conventional integrated circuits, b) providing one or more sub-substrates, wherein each sub-substrate comprises one or more interconnected electronic devices to perform one or more electronic sub-functions, c) designing an interconnection pattern between the one or more sub-substrates and the pre-provided conventional integrated circuits on the master substrate, d) fixedly placing the one or more sub-substrates on the master substrate and e) direct printing the interconnection pattern to provide the custom printed circuit with one or more of the desired electronic function that is a combination of the sub-functions of the sets of interconnected electronic devices.

According to a first aspect of the present invention, a process is provided for creating a custom printed circuit with one or more desired electronic functions comprising: a) providing a set of conventional interconnected electronic devices on a substrate; b) designing an interconnection pattern between the set of interconnected electronic devices to create the one or more electronic functions; and c) direct printing the interconnection pattern to provide the custom printed circuit board with the one or more desired electronic functions on the substrate.

According to the first aspect of the present invention, the set of conventional electronic devices are located on a first side of the substrate, and the interconnection pattern is provided on a second side of the substrate. According to the first aspect of the present invention, the set of conventional electronic devices are located on alternate sides of the substrate, and the interconnection pattern is provided on alternate sides of the substrate.

According to the first aspect of the present invention, the process further comprises d) designing a set of electronic devices that can be direct printed on an alternate side of the substrate from the set of conventional electronic devices; e) designing an interconnection pattern between the set of conventional electronic devices and the set of direct printed electronic devices; and f) direct printing both the set of electronic devices and the interconnection pattern between the set of conventional electronic devices and the set of direct printed electronic devices on the substrate.

According to a second aspect of the present invention, a process is provided for creating a custom printed circuit with one or more desired electronic functions comprising: a) providing a master substrate pre-provided with one or more conventional integrated circuits; b) providing one or more sub-substrates, wherein each sub-substrate comprises one or more interconnected electronic devices to perform one or more electronic sub-functions; c) designing an interconnection pattern between the one or more sub-substrates and the pre-provided conventional integrated circuits on the master substrate; d) fixedly placing the one or more sub-substrates on the master substrate; and e) direct printing the interconnection pattern to provide the custom printed circuit with one or more of the desired electronic function that is a combination of the sub-functions of the sets of interconnected electronic devices on the one or more substrates.

According to a third aspect of the present invention, a system is provided for creating a custom printed circuit with one or more desired electronic functions on a substrate pre-provided with a set of conventional interconnected electronic devices comprising: a) a processor configured to design an interconnection pattern between the set of interconnected electronic devices to create the one or more electronic functions; and b) a direct printing device configured to print the interconnection pattern to provide the custom printed circuit board with the one or more desired electronic functions on the substrate.

According to the third aspect of the present invention, the set of conventional electronic devices are located on a first side of the substrate, and the interconnection pattern is provided on a second side of the substrate. According to the third aspect of the present invention, the set of conventional electronic devices are located on alternate sides of the substrate, and the interconnection pattern is provided on alternate sides of the substrate.

According to the third aspect of the present invention, the processor is further configured to design a set of electronic devices that can be direct printed on an alternate side of the substrate from the set of conventional electronic devices; design an interconnection pattern between the set of conventional electronic devices and the set of direct printed electronic devices; and the direct printing device is further configured to print both the set of electronic devices and the interconnection pattern between the set of conventional electronic devices and the set of direct printed electronic devices on the substrate.

According to a fourth aspect of the present invention, a system is provided for creating a custom printed circuit with one or more desired electronic functions using a master substrate pre-provided with one or more conventional integrated circuits, and one or more sub-substrates fixedly placed on the master substrate, wherein each sub-substrate comprises one or more interconnected electronic devices to perform one or more electronic sub-functions, comprising: a) a processor configured to design an interconnection pattern between the one or more sub-substrates and the pre-provided conventional integrated circuits on the master substrate, wherein one or more sub-substrates has been fixedly placed on the master substrate; and e) a direct printing device configured to print the interconnection pattern to provide the custom printed circuit with one or more of the desired electronic function that is a combination of the sub-functions of the sets of interconnected electronic devices on the one or more substrates.

According to a fifth aspect of the present invention, a computer-readable medium containing a computer program is provided for creating a custom printed circuit with one or more desired electronic functions on a substrate provided with a set of conventional interconnected electronic devices, wherein the computer program performs the steps of: a) designing an interconnection pattern between the set of interconnected electronic devices to create the one or more electronic functions; and b) causing a direct printing device to print the interconnection pattern to provide the custom printed circuit board with the one or more desired electronic functions on the substrate.

According to the fifth aspect of the present invention, the set of conventional electronic devices are located on a first side of the substrate, and the interconnection pattern is provided on a second side of the substrate. According to the fifth aspect of the present invention, the set of conventional electronic devices are located on alternate sides of the substrate, and the interconnection pattern is provided on alternate sides of the substrate.

According to the fifth aspect of the present invention, the computer program further comprises the steps of c) designing a set of electronic devices that can be direct printed on an alternate side of the substrate from the set of conventional electronic devices; d) designing an interconnection pattern between the set of conventional electronic devices and the set of direct printed electronic devices; and e) causing a direct printing device to print both the set of electronic devices and the interconnection pattern between the set of conventional electronic devices and the set of direct printed electronic devices on the substrate.

According to a sixth aspect of the present invention, a computer-readable medium containing a computer program is provided for creating a custom printed circuit with one or more desired electronic functions using a master substrate pre-provided with one or more conventional integrated circuits, and one or more sub-substrates fixedly placed on the master substrate, wherein each sub-substrate comprises one or more interconnected electronic devices to perform one or more electronic sub-functions, wherein the computer program performs the steps of: a) designing an interconnection pattern between the one or more sub-substrates and the pre-provided conventional integrated circuits on the master substrate; and b) causing a direct printing device to print the interconnection pattern to provide the custom printed circuit with one or more of the desired electronic function that is a combination of the sub-functions of the sets of interconnected electronic devices on the one or more substrates.

According to a seventh aspect of the present invention, a system is provided for creating a custom printed circuit with one or more desired electronic functions on a substrate provided with a set of conventional interconnected electronic devices, comprising: a) means for designing an interconnection pattern between the set of interconnected electronic devices to create the one or more electronic functions; and b) means for direct printing the interconnection pattern to provide the custom printed circuit board with the one or more desired electronic functions on the substrate.

According to the seventh aspect of the present invention, the set of conventional electronic devices are located on a first side of the substrate, and the interconnection pattern is provided on a second side of the substrate. According to the seventh aspect of the present invention, the set of conventional electronic devices are located on alternate sides of the substrate, and the interconnection pattern is provided on alternate sides of the substrate.

According to the seventh aspect of the present invention, the system further comprises: c) means for designing a set of electronic devices that can be direct printed on an alternate side of the substrate from the set of conventional electronic devices; d) means for designing an interconnection pattern between the set of conventional electronic devices and the set of direct printed electronic devices; and e) means for direct printing both the set of electronic devices and the interconnection pattern between the set of conventional electronic devices and the set of direct printed electronic devices on the substrate.

According to an eighth aspect of the present invention, a system is provided for creating a custom printed circuit with one or more desired electronic functions using a master substrate pre-provided with one or more conventional integrated circuits, and one or more sub-substrates fixedly placed on the master substrate, wherein each sub-substrate comprises one or more interconnected electronic devices to perform one or more electronic sub-functions, comprising: a) means for designing an interconnection pattern between the one or more sub-substrates and the pre-provided conventional integrated circuits on the master substrate; and b) means for direct printing the interconnection pattern to provide the custom printed circuit with one or more of the desired electronic function that is a combination of the sub-functions of the sets of interconnected electronic devices on the one or more substrates.

BRIEF DESCRIPTION OF THE DRAWINGS

The novel features and advantages of the present invention will best be understood by reference to the detailed description of the preferred embodiments which follows, when read in conjunction with the accompanying drawings, in which:

FIG. 3A illustrates a top view of another custom printed circuit board manufactured according to an embodiment of the present invention;

FIGS. 3B-3D illustrate schematics of different types of electronic devices that can be included in the custom printed circuit board shown in FIG. 3A;

FIGS. 4A-4C illustrate circuit schematic symbols of the electronic devices shown in FIGS. 3B-3D, respectively;

DETAILED DESCRIPTION OF THE PREFERRED EMBODIMENTS

Figure 1:
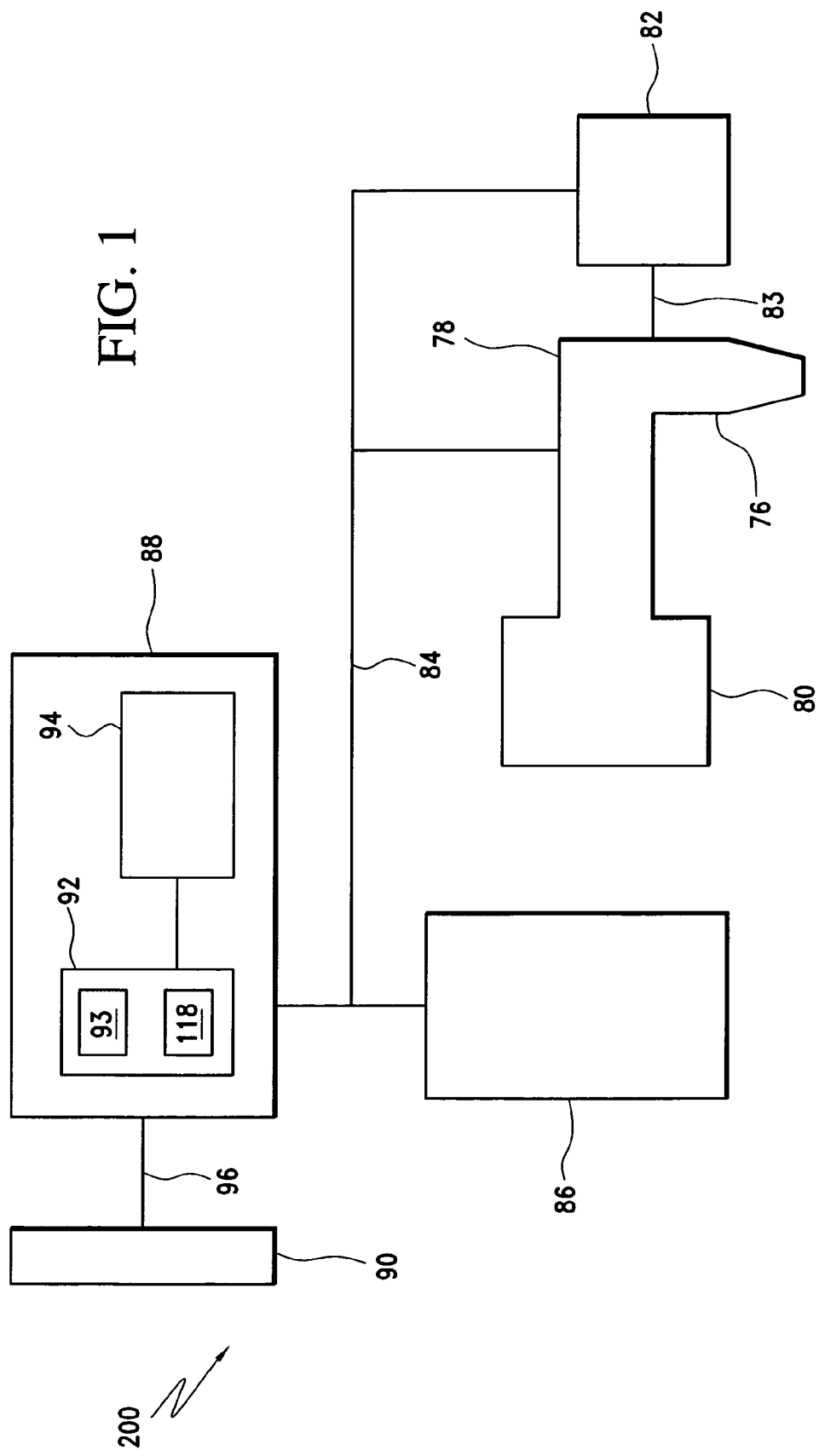
FIG. 1 illustrates a block diagram of a direct printing system according to an embodiment of the present invention.

The various features of the preferred embodiments will now be described with reference to the drawing figures, in which like parts are identified with the same reference characters. The following description of the presently contemplated best mode of practicing the invention is not to be taken in a limiting sense, but is provided merely for the purpose of describing the general principles of the invention. This application is also related to co-pending U.S. Non-provisional patent application Ser. No. 11/331,189, filed on Jan. 13, 2006, entitled "A System and Process for Manufacturing Application Specific Printable Circuits (ASPC's) and Other Custom Electronic Devices," by Chuck Edwards.

FIG. 1 illustrates a block diagram of a direct printing system 200 that can be used to manufacture application specific printable circuits (ASPC's) according to an embodiment of the present invention. Many different types of direct printing processes can be used to manufacture ASPC's or custom circuit boards. Such direct printing processes can include standard lithographic offset printing, flexography printing, laser printing, screen mesh printing, gravure printing, ink jet printing, among others. The discussion herein of the direct printing system 200 is but one exemplary embodiment, and included for purposes of illustration only. The systems and processes according to an embodiment of the present invention are not to be construed to be limited to the exemplary embodiment of the direct printing system 200, as one skilled in the art can appreciate. Furthermore, those of ordinary skill in the art can appreciate that the system and process according to the embodiments of the present invention need not be incorporated in one external direct printing device 200. The system and process of the present invention can be distributed among two or more printing and/or processing devices, including distributed networks (i.e., LAN, WAN, the Internet, among others).

In FIG. 1, motor and drive assembly 82 receives commands from processor board 88 that places the print head 78 at expected print positions according to the print data file 118 received by the processor board 88. The motor and drive assembly receives data and commands via bus 84 from processor 94, and locates the print head 78 with the use of either a belt system 83, a gear system, or any other type of mechanical apparatus for precisely locating the print head 78. As part of the print head 78, there is a nozzle 76 and ink reservoir 80. A laser interferometer 86, or other type of distance measuring device, can be located substantially adjacent to the print head 78 for measuring the height of the print head 78 above the surface of the substrate 8 (shown in FIG. 2). Use of the laser interferometer 86 is not necessary for manufacturing ASPC's and custom circuits according to an embodiment of the present invention, and is included only for purposes of illustration, and not in a limiting manner, as one skilled in the art of the present invention can appreciate. Other components of the direct printing system 200 according to an embodiment of the present invention include the bus (data and command) 84, memory 92, an input/output (I/O) connector 90, and a second data/command bus 96 connecting the I/O connector 90 and the processor board 88. The processor board 88 receives all or some of a print data file 118, after it has been compiled, from an external source, which is then processed by the processor 94 to create printing commands. Conventional printing systems are well known to those of ordinary skill in the art, and the direct printing system 200 according to an embodiment of the present invention performs similarly to the conventional systems in receiving data and commands from an external source thereof. Operations relating to receipt of the print data file 118 from the external source will not be repeated here for purposes of brevity and clarity, as it is presumed that those skilled in the art of the present invention understand such operations. Examples of such direct printing systems 200 include ink jet printers, laser printers (xerographic printing), screen mesh printers, lithographic offset printers, flexography printers, and gravure printers, among others.

As illustrated in FIG. 1, processor board 88 comprises processor 94 which can be one or more general or special purpose processors, and memory 92, which itself comprises printing software 93. Memory 92 can comprise an input buffer, printing software 93, and an output buffer. It should be noted that in this exemplary embodiment of the present invention, a database, which is not shown, can be a separate hardware memory item, though that need not always be the case. The database can also be implemented as a portion of the memory 92. The database can contain any stored information that memory 92 can store, including, for example, print data file 118, printing software 93, and/or other information, programs, applications, and the like.

Printing software 93 comprises one or more computer programs that can be stored on any type of computer readable medium or other data storage devices. These additional data storage devices can include removable and/or non-removable devices, such as, for example, magnetic disks, optical disks, or tape. Computer readable medium can include volatile and nonvolatile, removable and non-removable medium implemented in any method or technology for storage of information, such as computer readable instructions, data structures, program modules, or other data. Computer readable medium can include, by way of a non-limiting example, random access memory (RAM), read-only memory (ROM), electrically erasable programmable ROM (EEPROM), computer disk ROMs (CD-ROMS), digital versatile disks (DVDs), magnetic tape, flash memory, bubble memory devices, optical storage devices, floppy disks, hard drives, and any other type of memory storage devices (e.g., memory sticks, microcassettes, among other types of devices). As discussed in greater detail below, the various embodiments of the present invention comprise one or more methods, as shown and described in reference to FIGS. 5, 11, 12, and 15. Each and all of these methods can be embodied as printing software 93. Printing software 93 accepts print data file 118 and processes it according to a particular embodiment of the present invention to print on non-uniform substrates. According to an exemplary embodiment of the present invention, printing software 93 accepts print data file 118 to print interconnects on a substrate that can be pre-provided with electronic devices. According to another exemplary embodiment of the present invention, printing software 93 accepts print data file 118 to print interconnects on a substrate that can be pre-provided with functional blocks of electrical devices. According to a further exemplary embodiment of the present invention, printing software 93 accepts print data file 118 to direct print interconnect paths on a substrate that can be pre-provided with an array of programmable read-only memory transistors and other electronic devices.

Any and all components of the direct printing system 200, shown and discussed in regard to FIG. 1, including, but not limited to I/O connector 90, processor 94, memory 92, laser interferometer 86, print head 78, and motor and drive assembly 82 (among other components), can be any suitable type of electrical or electronic device capable of performing the functions for direct printing system 200 and its components as discussed herein. For example, direct printing system 200 can comprise hardware, software, firmware or any suitable combination thereof.

Alternatively, direct printing system 200, and any and all components thereof, including, but not limited to, processor 94, laser interferometer 86, print head 78, and motor and drive assembly 82 (among other components), can be comprised of any suitable type of processor, including any type of microprocessor, microcontroller, digital signal processor (DSP), application-specific integrated circuit (ASIC), programmable read-only memory (PROM), erasable programmable read-only memory (EPROM), electrically-erasable programmable read-only memory (EEPROM), or the like. The direct printing system 200, and any and all components thereof, including, but not limited to, processor 94, and memory 92, laser interferometer 86, print head 78, and motor and drive assembly 82 (among other components), can be connected to or include a memory, such as, for example, any type of computer memory or any other type of electronic storage medium, such as, for example, read-only memory (ROM), random access memory (RAM), cache memory, compact disc read-only memory (CDROM), electro-optical memory, magneto-optical memory, or the like. The processor and memory can be used, for example, to perform some or all of the functions of the direct printing system 200, and any and all components thereof, including, but not limited to, processor 94, and memory 92, laser interferometer 86, print head 78, and motor and drive assembly 82 (among other components), described herein. As will be appreciated based on the foregoing description, the memory can be programmed using conventional techniques known to those having ordinary skill in the art of computer programming. For example, the actual source code or object code of the computer program can be stored in the memory 92.

Further still, as one of ordinary skill in the art can appreciate, printing software 93 does not necessarily need to reside in memory 92. Or, alternatively, only part of printing software 93 can reside in memory 92. Printing software 93 can reside in any of the type of memory 92 as discussed above in greater detail that is associated with a computer (e.g., laptop, desk set, server, workstation, among others) that communicates with direct printing system 200. In this way, then, the computer (not shown) becomes part of direct printing system 200, along with any network that the computer might use as a means of communications with direct printing system 200 (including, for example, a local area network, wide area network, the internet, a WiFi system, Bluetooth, among others) and that is connected to the computer and direct printing system 200.

As discussed briefly above, the laser interferometer 86 measures the distance from the print head 78 to the surface of the substrate 8. The details of how the direct printing system 200 uses such height data in direct printing onto the substrate 8 are not necessary for understanding the embodiments of the present invention disclosed herein. A discussion of the operation and use of the laser interferometer 86, however, can be found in co-pending U.S. Non-provisional patent application Ser. No. 11/331,190, entitled "Printable Electronic Features on Non-Uniform Substrate and Processes for Making Same," by Karel van Heusden, et al., filed on Jan. 13, 2006.

Figure 2:
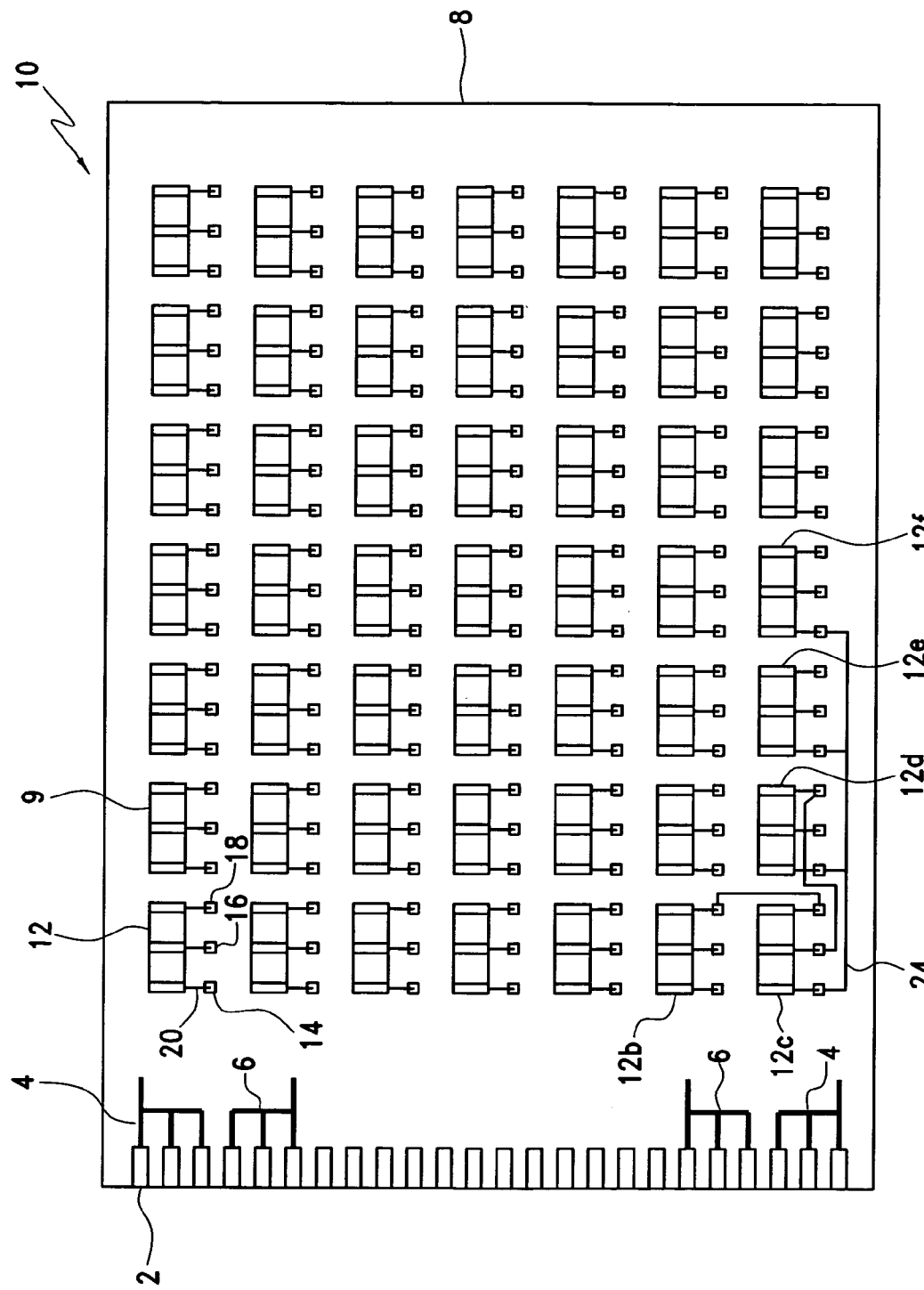
FIG. 2 illustrates a top view of a custom printed circuit board manufactured according to an embodiment of the present invention.

FIG. 2 illustrates a top view of a custom printed circuit board 10, comprising a substrate 8 with pre-printed electronic circuits. The custom printed circuit board 10 shown in FIG. 2, can be created by the direct printing system 200 and process 100 discussed in reference to FIG. 3. Alternatively, the custom printed circuit board 10 can be manufactured using several different types of printing systems and processes for printing conductive traces, as well as some passive components. For example, traditional offset lithography printing can be used to manufacture the custom printed circuit 10 according to the processes described herein according to an embodiment of the present invention, as well as laser printing, ink jet printing, gravure printing, flexography printing, and screen mesh printing can be used to manufacture the custom printed circuit 10 according to the processes described herein according to an embodiment of the present invention. The custom printed circuit board 10, shown in FIG. 2, is an example of custom printed circuit boards that can be manufactured by the direct printing system 200 and process 100 according to an exemplary embodiment of the present invention. For purposes of this discussion, the exemplary custom printed circuit board 10 has been shown in a very simple form; generally, custom printed circuit boards will be much more complex, and filled with a significantly larger quantity of electronic devices, though this need not always be the case. The custom printed circuit board 10 should therefore not be considered in any manner to be a limiting example; it has been shown as thus in order to make the embodiments of the present invention easier to understand.

The custom printed circuit board 10 comprises a substrate 8 that is pre-provided with a plurality of different types of electronic devices, in various quantities. These electronic devices 9 include, but are not limited to, transistors, resistors, capacitors, inductors, diodes, photodiodes, light emitting diodes, buffer circuits, transmitter and receiver circuits, input/output circuit devices, logic gates, input/output terminals, memory circuits, line drivers, microprocessors, display devices, and sensor devices, power supply devices such as super-capacitors, batteries, printed batteries, photovoltaic cells, printed photovoltaic cells, and other suitable electronic and electrical devices. According to an embodiment of the present invention, the electronic devices 9 can be pre-provided in several different manners and forms. For example, the electronic devices 9 can be pre-printed by an identical direct printing system 200, or another type of direct printing system, that is capable of printing electronic devices 9 onto the substrate 8. In another embodiment of the present invention, the pre-provided electronic devices 9 can be provided on a traditional printed circuit board substrate with conventional integrated circuit packages, such single in-line package (SIP), dual in line package (DIP), surface mount, and the like. These are well known to those of ordinary skill in the art. The substrates 8 that are pre-provided with electronic devices 9 can, in an exemplary embodiment of the present invention, be manufactured as a "base layer" component for customizers who then design custom circuits for other manufacturers or end users of the custom circuit board.

In the exemplary embodiment shown in FIG. 2, the electronic devices 9 comprise a plurality of transistors 12. Each transistor 12 has, for example, an emitter, base and collector, each of which are connected, respectively, to an emitter pad 14, base pad 16 and collector pad 18 by a conductive lead 20. In other exemplary embodiments, the transistors 12 can be pre-provided on the substrate 8 with certain groups of them already connected together to form minor electronic function devices. Examples of simple electronic devices 9 that can be pre-provided on the substrate 8 are clocks, sensors, and logic gates. In an exemplary embodiment of the present invention, clocks, sensors and logic gates can be pre-provided on a flexible, substantially non-rigid substrate in the form of, for example, a pill dispensing device. For example, pill dispensing devices are commonly used in the medical industries (i.e., drug companies) to track drug usage for certain patients, especially those involved in drug efficacy trials. These pill dispensing devices can have circuitry to track when a patient takes the drug, and can allow the patient to provide some information related to the drug taking event. In an exemplary embodiment of the present invention, a substrate 8 can be manufactured with the above mentioned circuitry (logic gates, clocks, sensors) that tracks the pill taking event. The drug companies can then print on the pill dispensing device certain questions that will be associated with certain sensors, so that the data can be tracked. In another embodiment of the present invention, the drug companies can also print conductive traces according to the embodiments of the present invention described herein that allows them to customize the circuit design according to their needs.

The substrate 8 with the plurality of electronic devices 9 can also include a plurality of pre-provided terminal connectors 2, which can also be direct printed on the substrate 8 or attached in a more conventional manner, depending upon the substrate material. In FIG. 2, the terminal connectors 2 are shown as being located on just one side of the substrate 8, but can actually be located anywhere, and even on an opposite side as the side the plurality of electronic devices 9 are located. In FIG. 2, several of the terminal connectors 2 are shown interconnected. For example, the first group comprises a power conductor 4 (of which there are two such interconnected groups) and the second group comprises a ground plane conductor 6 (of which there are also two such interconnected groups. The manner in which the two interconnected groups 4, 6 are shown in FIG. 2 is not a limiting example, as one of ordinary skill in the art of the present invention can appreciate. Indeed, as will be described in greater detail below, with the use of insulating layers 22 (shown and described in greater detail below in reference to FIG. 6), conductive traces 24 can be provided between any two or more terminal connectors 2 (or the connectors of other electronic devices) in any suitable layout.

The substrate 8 can be a flexible, substantially non-rigid substrate. Alternatively, the substrate 8 can be a non-flexible, substantially rigid substrate. The substrate 8 in this embodiment can be any of the substrate materials described herein. In one exemplary embodiment, the substrate 8 has opposing major planar surfaces. The types of substrates 8 that are particularly useful according to an embodiment of the present invention include polyfluorinated compounds, polyimides, epoxies (including glass-filled epoxy), polycarbonates and other polymers. Other useful low-cost substrates 8 include cellulose-based materials, such as wood, paper, cardboard, or other wood pulp based materials, acetate, polyester, such as PET or PEN, polyethylene, polypropylene, polyvinyl chloride, acrylonitrile, butadiene (ABS), flexible fiber board, nonwoven polymeric fabric, cloth, metallic foil, silicon, and glass. In another embodiment of the present invention, the substrate 8 comprises a component selected from the group consisting of an organic substrate, a glass substrate, a ceramic substrate and a polymeric substrate. The substrate 8 can be coated, for example, with a dielectric on a metallic foil. Although the present invention can be used for such low-temperature substrates, it will be appreciated that traditional substrates such as ceramic substrates can also be used in accordance with embodiments of the present invention.

The processes of the present invention also enable the formation of conductive features onto non-planar substrates, such as curved substrates or substrates that have a stepped feature on the substrate surface. The conductive features can also be well adhered, such that a flexible substrate can be rolled or otherwise flexed without damaging the integrity of the conductive feature.

FIG. 3A illustrates a top view of a custom printed circuit board 8 with a plurality of pre-provided electronic devices 9 fabricated from a plurality of transistors, resistors and capacitors. As discussed above, the substrate 8 can be supplied to a user with pre-provided electronic devices 9. In an exemplary embodiment of the present invention shown and described in reference to FIG. 3A, these electronic devices 9 can include a plurality of transistors, resistors, and capacitors. As shown in FIGS. 3A-3D, a plurality of transistors, resistors and capacitors are pre-provided, but are now interconnected as logic gates and other types of electronic devices. For example, in FIG. 3A, there are several different types of electronic devices 9. Some of these electronic devices 9 are different logic gates that can be constructed from 2, 3, 4, or even more transistors 12. FIG. 3B is a greatly enlarged view of a logic gate. The logic gate, in this example, an AND gate, is made up of 2 transistors, three resistors and one capacitor, interconnected by conductive traces 24. The user of the design tool would not see the individual transistors 12, but instead only the circuit symbol of an AND gate, with two inputs 66a, 66b, and one output 72 (FIG. 4A). The individual logic gates in FIG. 3B are generally much smaller than the naked eye can discern. FIGS. 3C and 3D each show a NAND gate and an OR gate, respectively. FIGS. 4B and 4C each show the circuit schematic symbol that the user, when using the design tool, would see when designing the custom circuit. The first and second inputs for the logic gate, $I_1$ and $I_2$, are the first and second inputs to the electronic device 66a, 66b, and the output for the logic gate $O_1$ is equivalent to the output of the electronic device 72. The user uses the design tool to draw interconnection paths among the logic gates, I/O circuits and connectors, and other types of electronic devices 9 that can be pre-provided on the substrate 8. All the conductive traces 24 shown in the enlarged views (i.e., FIG. 3B) are pre-provided by the manufacturer of the substrate 8. Although they are not shown in FIGS. 3B-3D, or 3A, the power lead to each electronic device 68 can be interconnected by conductive traces 24 and connected to one or more of the terminal connector pads by the manufacturer of the substrate 8. Similarly, the ground lead for each electronic device 70 can also be interconnected by conductive traces 24 and connected to one or more of the terminal connector pads by the manufacturer of the substrate 8.

Furthermore, as discussed above, all the transistors, resistors and capacitors, and even I/O connectors can be direct printed on the substrate 8 by the manufacturer of the substrate 8. The level of sophistication needed for the transistors will be a factor in determining which printing process to use in direct printing the transistors. More sophisticated transistors will require closer tolerances in printing that can be generally achieved by the lithographic offset printing process. Of course, all of the direct printing processes discussed herein are capable of direct printing transistors, but not all processes can print the transistors as small as lithographic offset printing, with the amount of detail it can. The user can use the design tool to draw interconnection paths between the individual logic gates, I/O connectors and other electronic devices 9 that can also be included on the substrate 8. The same or different printing process used to print the pre-provided electronic devices 9 (i.e., logic gates, among others) shown in FIG. 3A can be used to print the conductive paths, at the user's own facility. For example, the substrate 8 can be pre-provided with the transistors 12, resistors, capacitors and I/O connectors with lithographic offset printing technology, which allows very high resolution printing, thereby allowing the manufacturer of the substrate 8 to create larger quantities of transistors on a given substrate 8 size. These transistors can be grouped together to form specific electronic devices, as discussed above, such as the NAND gates. The user can also use lithographic offset printing if desired, even if only conductive traces 24, resistors, and capacitors are to be added. Alternatively, the user can use other types of direct printing processes depending on the ultimate use and cost of the custom printed circuit 10. Some of the other types of direct printing are less expensive than lithographic offset printing, but are also less precise than lithographic offset printing.

Figure 5:
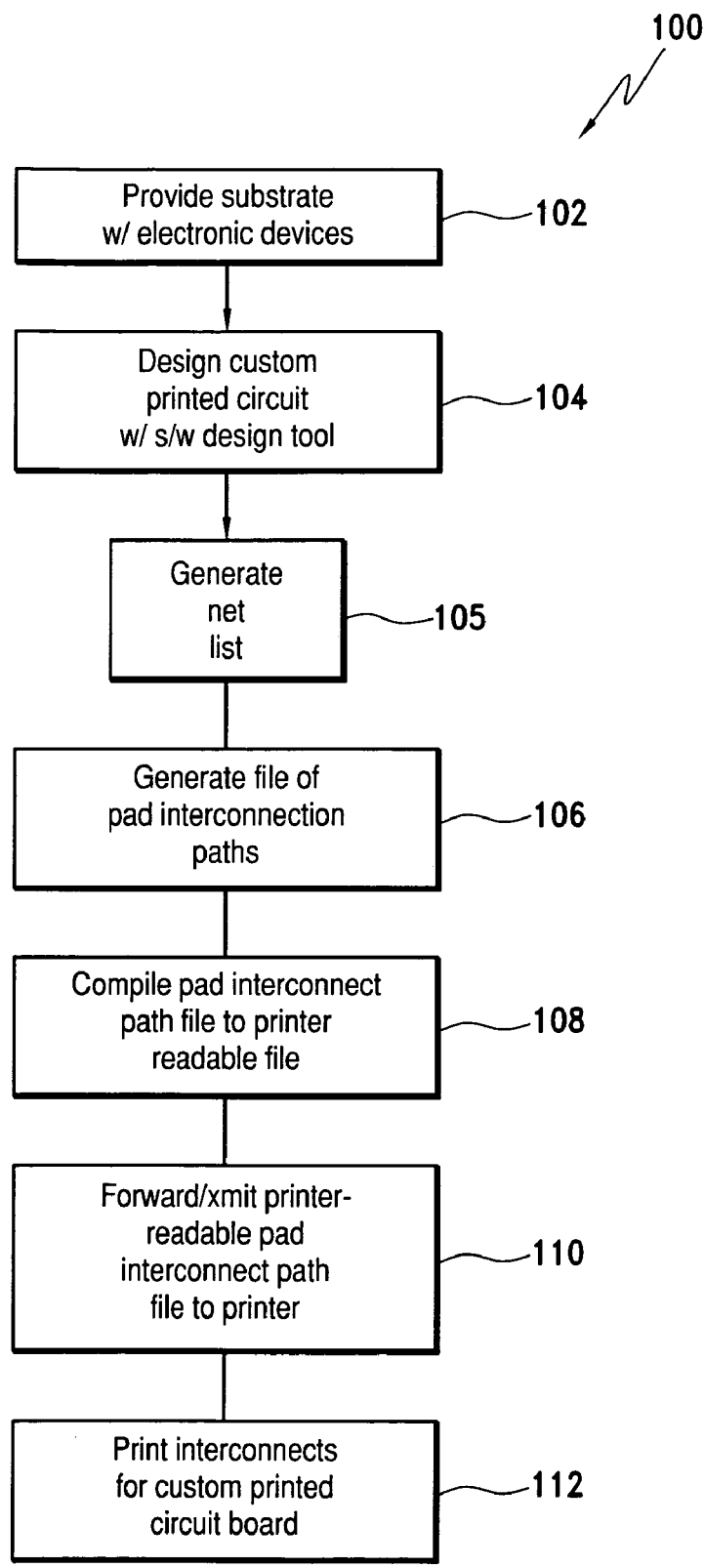
FIG. 5 illustrates a flow diagram of a process for manufacturing custom printed circuits according to an embodiment of the present invention.

FIG. 5 illustrate a flow diagram of a process 100 for manufacturing a custom printed circuit board 10 according to an embodiment of the present invention. The process 100 begins with step 102, in which the substrate 8 with pre-printed electronic devices 9 is provided to a user of a direct printing system 200 that can create custom printed circuit boards 10 according to an embodiment of the present invention.

As discussed above, the substrate 8 is pre-provided with a plurality of electronic devices, and these electronic devices 9 can encompass many different types of well known electronic functions. In one exemplary embodiment of the present invention, the substrate 8 can be pre-provided with several thousand, even as many several tens or hundreds of thousands of transistors 12. Each transistor will have at least three connections: an emitter pad 14, a base pad 16 and a collector pad 18. The pads 14, 16 and 18 can be interconnected with conductive traces 24 provided by the direct printing system 200. The user of the direct printing system 200 can then use several different tools to create the interconnection patterns.

In step 104, the user of the direct printing system 200 designs the custom printed circuit board 10 using a software based electronic circuit design tool (design tool). The design tools available to the user of the direct printing system 200 include a combination of two or more conventional electronic circuit design tools, proprietary software designed for use on a particular embodiment of the direct printing system 200, or can be other well known software design tools for designing electronic circuits. Each type of design tool is well known to those of ordinary skill in the art of the present invention. Examples of well known software design tools for creating electronic circuits include a very high speed integrated circuit hardware description language (VHDL) software tool. Typically, the design tool can include at least three components: 1) a symbol library, which uses schematic symbols to design and draw a circuit using a CAD system; 2) circuit simulation software to simulate the performance of the designed circuit; and 3) a layout library, which translates the designed circuit into a layout for the electronic inks.

The design tools are multi-functional and versatile, and allow the user to create the custom printed circuit board 10 in several different ways. For example, the design tool can allow the user to design the custom printed circuit from a library that defines circuit device symbols for the custom printed circuit board 10 in terms of the one or more electronic devices 9 provided on the substrate, or utilize the design tool to define the custom printed circuit board 10 in terms of the one or more electronic devices 9 provided on the substrate. The library can be obtained from a computer assisted engineering software tool. The latter process shall be discussed first.

To use the design tool to define the custom printed circuit in terms of the one or more electronic devices 9 provided on the substrate, the user draws interconnection paths between user selected electronic devices. The user can also, in another exemplary embodiment of the present invention, design additional resistors and capacitors for use in the custom circuit. These passive devices can be direct printed using any of the direct printing processes described herein. This can be accomplished by picking-and-placing the electronic device in the design tool circuit board (i.e., in a virtual circuit board on a computer screen), and then drawing the interconnection paths between the electronic devices. As discussed in greater detail below, the design tool can show physically how the set of electronic devices 9 that create the custom printed circuit is laid out on the substrate 8, along with the interconnection paths. The set of interconnection paths between each electronic device on the substrate 8 creates circuits to perform specific electronic functions. For example, smaller groups of electronic devices 9 can interconnected to design a logic AND or NAND gate. Or, the user can create analog devices, such as amplifiers, current control circuits, among others. Since the electronic devices 9 provided on substrate 8 can also include resistors, capacitors and inductors, among other devices, the user can incorporate these passive components as well into the user's custom circuit design. An example of a physical layout is shown in FIG. 2, in which transistors 12a-12f have been selectively interconnected to provide a first circuit. The user continues to select and interconnect electronic devices 9 until the desired electronic function for the custom printed circuit board is achieved.

Following completion of the circuit design for the custom printed circuit board, a first circuit design verification and analysis tool can be used to verify that the circuit works as intended, and determine its operating characteristics. As one of ordinary skill in the art can appreciate, this can include bode plots, timing diagrams for digital circuitry, among others. A more sophisticated second circuit design verification and analysis tool can be used to test the circuit(s) of the custom printed circuit board after the design tool has created a layout of the custom printed circuit board 10, which is discussed in greater detail below. Of course, as one skilled in the art of the present invention can appreciate, the first and second verification and analysis tools can be the same or different tools.

To use the design tool to design the custom printed circuit from a library that defines the custom printed circuit in terms of the one or more electronic devices 9 provided on the substrate, the design tool provides circuit device symbols that represent various electronic circuit functions that can be fabricated with the electronic devices 9 provided on the substrate 8. For example, if the substrate 8 is provided with at least transistors, resistors, capacitors, and I/O connectors, the design tool can allocate a first amount of transistors, resistors and capacitors to form logic gates, analog amplifiers, driver and receiver circuitry, among other devices. The design tool will already have a pre-provided layout of the chosen logic gates and other electronic circuit functions. The design tool does not show the user this allocation of transistors and/or passive components: instead, the design tool provides the standard circuit device symbol, and the user draws the interconnection paths between the main terminals of the circuit device symbol (e.g., a NAND gate with two inputs and one output (the main terminals)). As the user selects each circuit device symbol, the amount and type of electronic devices 9 (e.g., for a logic gate, this represents a certain number of transistors and perhaps other components) that are needed to make the desired electronic circuit function are deducted from the pool of available electronic devices. Of course, the design tool can also provide circuit device symbols of the electronic devices 9 that have been provided on the substrate 8 (e.g., the transistors, resistors, and other electronic devices) and the user can selectively choose those electronic devices 9 individually if desired. An example of this might be to add a current limiting circuit made from several transistors or a diode from a single transistor.

The user continues to build the custom printed circuit board with circuit device symbols until the desired electronic function is achieved, or the substrate 8 is depleted of electronic devices. If the latter occurs, the user must redesign the custom printed circuit board realizing the practical constraints. Following completion of the circuit design for the custom printed circuit board 10, a first circuit design verification and analysis tool (analysis tool) can be used to verify that the circuit works as intended, and determine its operating characteristics (this is identical to the "circuit simulation software" discussed briefly above). As one of ordinary skill in the art can appreciate, this can include bode plots, timing diagrams of digital circuitry, among other design verification tools. A more sophisticated second circuit design verification and analysis tool can be used to test the circuit(s) of the custom printed circuit board after the design tool has created a layout of the custom printed circuit board, which is discussed in greater detail below. Of course, as one skilled in the art of the present invention can appreciate, the first and second verification and analysis tools can be the same or different tools. Virtually any electronic function can be designed onto the custom printed circuit board using either the library or libraries, or the electronic devices 9 themselves.

Once the user has designed the custom printed circuit board 10 to include one or more major electronic functions, the design tool creates a net list in step 105. Net lists are a simple list of interconnected points. For example, if a first pin on a first integrated circuit device (commonly referred to as "Un"; where "n" equals some number) is connected to a second pin on a second device and a second pin on a third device, the net list could look like this: U1(1)-U2(2)-U3(2), and so on. In step 106, the design tool then generates a file of pad interconnection paths (step 106 of process 100), based, in part, on the net list. The design tool can also display the pad interconnection paths on a screen or display for the user to view, and possible alter as desired. Changing the pad interconnection paths does not change the net list; however, changing the net list will necessarily change the pad interconnection paths.

Following the step of generating the pad interconnection paths, the design tool, with knowledge of the substrate 8, its collection of various types of electronic devices, and their physical geometries, will provide the most efficient set of pad interconnection paths possible, taking into account the direct printing system's 200 ability to lay insulating layers over conductive paths, or even electronic devices, to provide a shortest route possible between two (or more) pad interconnection points. The pad interconnection paths are created for both the circuit device (i.e., a logic gate fabricated from transistors, resistors, and/or capacitors), and the pad interconnect paths between the circuit devices (i.e., inputs to the NAND gate and its outputs). In addition, the design tool can take into account maximum heights, the different types of inks that can be used, impedances of the conductive paths, if necessary, power requirements, and many other factors. All this information can be taken into account to create the pad interconnection paths, which are then stored in a separate file, the pad interconnection file.

Following the generation of the pad interconnection file, the design tool can then run the second design verification and analysis tool (second analysis tool). The second analysis tool performs a more sophisticated function at this point than the first analysis tool, as it takes into account the nature of the exact paths of interconnection between the electronic devices 9 on the particular pre-provided substrate 8. The second analysis tool takes into account the effect of crosstalk, differing impedances, interference from exterior sources, variances in the power supplies, and other factors. If the design of the custom printed circuit board does not work as intended, the design tool can recommend to the user to redesign certain portions of the design, or suggest alternative interconnection layouts itself. Once the design for the custom printed circuit board is completed, process 100 proceeds to step 108.

In step 108, the pad interconnection path file is compiled so that it is put into a format that the direct printer system 200 can understand. The type of direct printing system 200 used will determine the format the compiled pad interconnection path file takes. In this sense, "compiled" means not only the traditional software or electronic sense of translating data from one form to another; it also means taking the pad interconnection path data and, in the case of a screen mesh printing system, flexography printing system, lithographic offset printing systems, and gravure printing system (i.e., the "physical direct printing systems"), generating a physical layout pattern that the physical direct printing systems can use to print on the substrate 8. The following discussion, however, will consider only the non-limiting exemplary embodiment of the present invention wherein the pad interconnection path data file is generated electronically, and will be used in either a laser or ink jet direct printing system. In this case, the printer driver software will transform the pad interconnection file into a format the direct printer system 200 can understand, the direct printer readable file.

The direct printer readable file provides a series of commands/data that the direct printer system 200 can use to actually print the interconnection paths on the pre-provided substrate 8. An equivalent function is performed in standard desktop personal computer printer driver software (driver software). Driver software transforms the data contained in (word processing) application program files into a format the attached ink jet, laser-jet or dot matrix printer can use. If a substrate 8 is placed in the direct printing system 200, the user forwards the direct printer readable file to the direct printing system 200 (step 110), which then prints the interconnection paths as provided (step 112).

Figure 6:
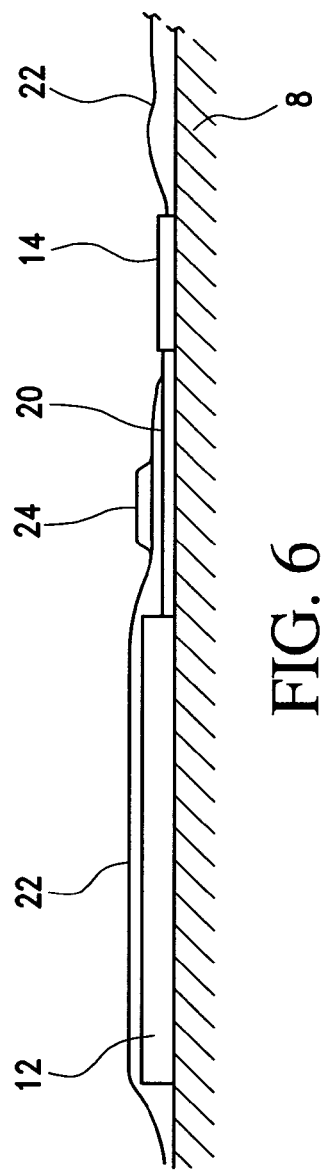
FIG. 6 illustrates a side view of several interconnections and insulating layers provided in and around one pre-printed transistor device on the custom printed circuit shown in FIG. 2.

As discussed above, the design tool can create interconnection paths that are maximized in terms of providing the shortest route possible between two or more pads or terminals on a circuit device. This provides the benefit of maximizing the use of the surface area of the substrate 8. This can, in some instances, allow greater circuit density, and/or smaller substrate size, saving money not only in the manufacture of the custom printed circuit, but if the custom printed circuit is being used in some device, possibly reducing its size as well (thereby providing additional savings). FIG. 6 illustrates a side view of several interconnections and insulating layers provided in and around one pre-printed transistor device on the custom printed circuit board 10 shown in FIG. 5. In FIG. 6, a transistor 12 is shown with a first conductive trace 20 between its emitter and an emitter pad 14. Then, an insulating layer 22 has been placed on top of the transistor 12 and the conductive trace 20, so that a second conductive trace 24 can be co-located over the conductive lead 20. Placing a conductive trace 24 over an insulating layer 22 in this manner can be done to provide the shortest possible path for a signal, or to provide power and/or ground planes. For example, once an entire custom printed circuit board 10 has been designed and all the interconnection paths provided, the direct printing system 200 according to an embodiment of the present invention can cover the entire custom printed circuit board 10 with an insulating layer 22 and then a ground plane layer (to minimize interference), and then cover the custom printed circuit board with another insulating layer 22 to keep dirt and moisture away from the conductive traces 20, 24 and electronic devices.

Custom printed circuit boards 10 with many different types of electronic functions can be manufactured using the direct printing system 200 and processes described herein according to the embodiments of the present invention. One particularly useful type of device is an radio frequency identification (RFID) tag. Conventional RFID tags suffer from at last two serious drawbacks. First, conventional RFID tags are not secure enough in that the data they contain can be easily re-written over by unauthorized persons. Re-writing, in most cases, would simply be annoying and/or a waste of time. In an airline luggage handling facility, or cargo shipping areas, however, re-writing of the data on an RFID tag can create much more serious situations. For example, if an infiltrator rewrites an RFID tag so that the container it is attached to passes through security much easier than it should, the consequences could be potentially catastrophic. The other serious drawback in some RFID tags is that in order to use them, they must be designed with both write and read circuitry. The write circuitry on the RFID tag receives an RF signal from a transceiver responsible for putting data into the RFID tag (i.e., storing the data into the RFID tag). The write receiver receives the data and writes it to the memory component of the RFID tag. Typically, the write circuitry is complex, even if it is implemented in the form of a laser receiver. The write circuitry is then typically never used again. However, the write circuitry provides an access point for unauthorized persons to enter unauthorized data into the RFID tag. Thus, not only does it provide an access point for unauthorized persons, it is normally used only once. Eliminating its use increases security and decreases the cost of the device.

Of course, prior art methods for manufacturing RFID devices can also "hard-wire" the data into the RFID device, wherein the problem of unauthorized writing can be alleviated. One significant difference between the prior art and the process for manufacturing an RFID according to an embodiment of the present invention is the ability to make the RFID device a secure, less costly device at the point of use, as opposed to a remote location. The process according to the embodiment of the present invention is therefore much more cost effective, efficient, and convenient, than prior art systems.

The direct printing system 200 and processes according to the embodiments of the present invention can substantially prevent unauthorized re-writing of RFID tags, and decrease the cost of manufacturing and using the same. The direct printing system 200 can quickly create a secure RFID tag that cannot be re-written because the data contained within is "hard-wired" on the custom printed circuit board 10. In this case, the substrate 8 can be paper, which is easily and readily printable, and can be combined with the pre-provided RF portion of the circuitry readily. In the RFID tag according to an embodiment of the present invention, the secure information is printed on the custom printed circuit in the form of a programmable read-only memory (PROM).

Figure 7:
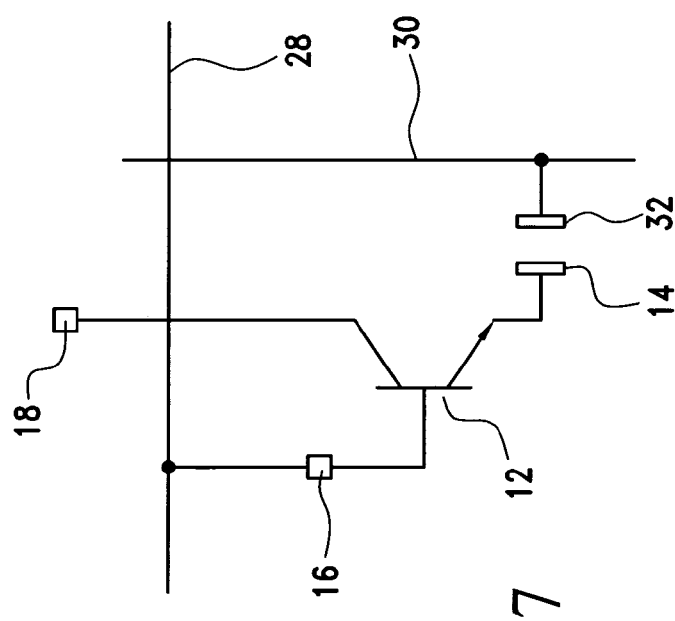
FIG. 7 illustrates a transistor that can be pre-provided on a substrate according to an embodiment of the present invention.

FIG. 7 illustrates a transistor 12 that can be pre-provided on a substrate 8 according to an embodiment of the present invention. The transistor 12 in the configuration shown in FIG. 7 can be used to create a PROM according to an embodiment of the present invention. Conventional PROM's contain transistors that are provided in matrix form. In conventional PROM's, a fusible link exists between the emitter pad 14 and the fuse pad 32. If a fusible link was provided between the emitter pad 14 and the fuse pad 32, it would either be left intact or blown to create the required logic level "1" or "0" at that location (intact="1"; open="0"). During the programming stage of the conventional PROM, all the appropriate "0" outputs are grounded. Then, each transistor 12 is turned on, and a current of a few tens of milli-amps flows through the fusible link, blowing it, creating the logic level "0". In the programmable PROM according to an embodiment of the present invention, however, there is no fusible link, only an opening between the crossover point (the space between the emitter pad 14 and fuse pad 32). Thus, a logic level "0" is built into the PROM device, and to create a logic level "1" a conductive trace needs to be applied between emitter pad 14 and the fuse pad 32.

As discussed above, the design tool can provide the user with the means to apply a conductive trace to each desired logic level "1" location, or, more conveniently, the design tool can have an auxiliary tool that receives data (user defined data) that is then processed by the design tool to create all the desired logic level "1" locations. This auxiliary tool interfaces with the design tool to provide the data in a correct format that the design tool can read, and which the design tool can then translate into the logic level "1" positions in the PROM matrix.

A direct printing system 200 that can create a programmable PROM according to this embodiment of the present invention can be approximately the size of a cell phone, and print out RFID tags with data acquired from many different sources (e.g., an attached computer, integral or attached keyboard, among others). Many others uses exist for such programmable PROM devices manufactured according to an embodiment of the present invention, including displays, which are discussed in greater detail below.

Another type of device that can be created with the direct printing system and processes according to an embodiment of the present invention are displays. These displays can include driver boards that can be created by the direct printing system 200. Types of displays that can be manufactured according to the direct printing system 200 and processes according to an embodiment of the present invention include electronic ink displays, electro-chemical displays, thermo-chromic displays, polymer dispersed liquid display terminals, organic light emitting diode display terminals and polymer organic light emitting diode display terminals. One exemplary use of the displays that can be manufactured according to an embodiment of the present invention include those that can be used on consumer product packages as described in greater detail below. Since the substrate 8 material is relatively inexpensive, and the cost of the direct printing ink composition in significant quantities is also relatively inexpensive, these displays can become consumable, throw-away devices. E-ink displays are well known to those of ordinary skill in the art of the present invention. In an e-ink display, a small electric field is required to change the opacity of the e-ink display in the vicinity of the electric field. Electric fields can be generated by turning on a transistor 12. Thus, the display driver 38 is similar to the programmable PROM 34, except it is configured to be covered by an e-ink display membrane (not shown). A conductive trace 24 is direct printed for each area on the e-ink display where the opacity is desired to be changed. Then, when appropriate signals are received by the display driver 38 (shown in FIG. 10), the e-ink membrane displays the message programmed into the display driver 38.

Thermo-chromic displays work in a similar fashion to that as e-ink displays. One of the differences between the two is the method in which the display material is activated. As discussed above, e-ink display material is activated by producing a small electric field near the display material that causes it to change its opacity. Thermo-chromic display material changes its opaqueness as a result of heat in proximity to the display material. Therefore, in a thermo-chromic display, messages, and designs can be displayed by placing resistors where the desired change in opaqueness of the thermo-chromic display material is to occur. Current is then passed through the resistor, generating heat (power=I2*R) that causes the opaqueness of the thermo-chromic display material to change. The resistors can be arranged in an array, similarly to the array of transistors used in PROMS. The array of resistors can be pre-provided by the manufacturer of the substrate 8. The user can print short conductive traces 24 connecting resistors to driver circuit that provides current under certain conditions, thereby displaying a message on the thermo-chromic display when desired. Alternatively, the manufacturer of the substrate need not provide the resistor array, and the user can print resistors and conductive traces 24 in desired locations to create messages.

Figure 8:
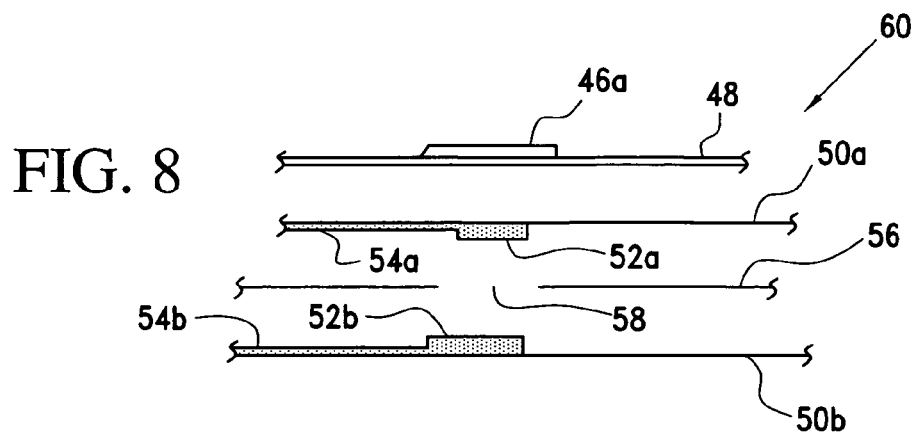
FIG. 8 illustrates a membrane keyboard assembly manufactured in part using the direct printing system shown in FIG. 1

Another example of a device that can be manufactured using the direct printing system 200 and processes described herein according to an embodiment of the present invention are membrane keyboards. FIG. 8 illustrates a membrane keyboard assembly manufactured in part using the direct printing system 200 shown in FIG. 1, and FIGS. 9A-9C illustrate several components pieces of the membrane keyboard assembly shown in FIG. 8. The dust-cover membrane 48 comprises a plurality of key buttons (labeled as F1-F10) 46. As one skilled in the art of the present invention can appreciate, the exemplary embodiment of the membrane keyboard 60 shown and described in reference with FIGS. 8 and 9A-9C are merely for purposes of explaining the embodiments of the present invention, and are not to be construed as limiting the embodiments of the present invention in any manner whatsoever.

The membrane keyboard 60 further includes a first trace layer 50a, an insulating membrane 56, and a second trace layer 50b. The first trace layer 50a, shown also in FIG. 9B, comprises a plurality keyboard buttons 46 (in this non-limiting example 10 keyboard buttons 46) periodically located in an uniform manner. In the membrane keyboard 60, a limited number of keyboard buttons 46 are shown for the purpose of simplifying the drawings and discussion herein. The first trace layer 50a comprises a plurality of key button pads 52, that can either be pre-printed on the pre-provided substrate 8, or designed and direct printed on the substrate 8 using the direct printing system 200 according to an embodiment of the present invention. Furthermore, additional functional blocks of electronic devices 9 can be included on the substrate 8 so that additional electronic functions can be direct printed on the substrate 8. This can include, for example, de-bouncer circuits, and resistors for pull-up and/or pull-down purposes. The user can use the design tool to design the key button conductive traces between the key button pads 52, connectors 2, and any other devices that can be incorporated into the membrane keyboard 60.

In an exemplary embodiment of the present invention, the key button pads 52, whether pre-provided by the manufacturer of the substrate 8, or direct printed by the user, use ink that is especially abrasion resistant. Use of the abrasion resistant ink is useful because of the manner in which the membrane keyboard operates. The two key button pads 52 will necessarily contact each other when the associated membrane keyboard button 46 is pressed by a user. The abrasion resistant ink prevents the key button pads from prematurely wearing out, thereby increasing the life expectancy of the membrane keyboard.

Figure 9A:
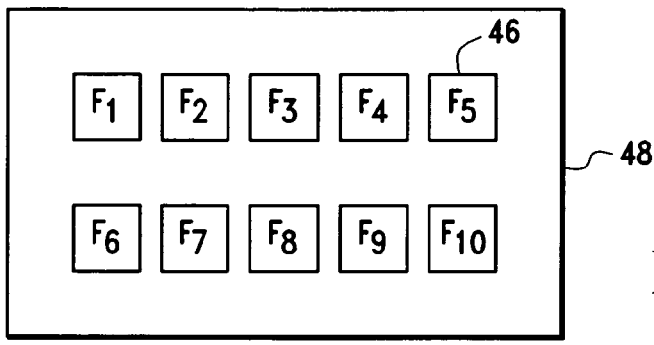
FIGS. 9A-9C illustrate several components pieces of the membrane keyboard assembly shown in FIG. 8.
Figure 9B:
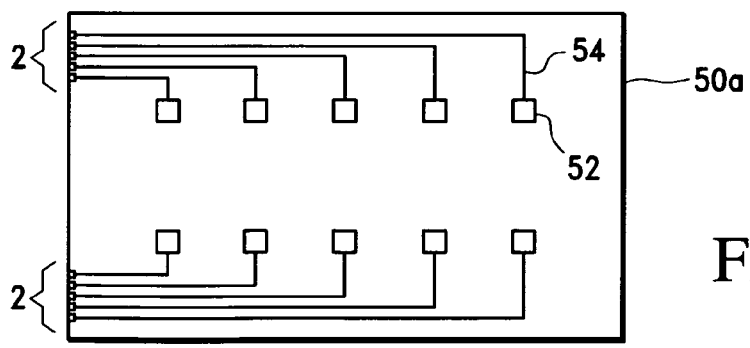
Figure 9C:
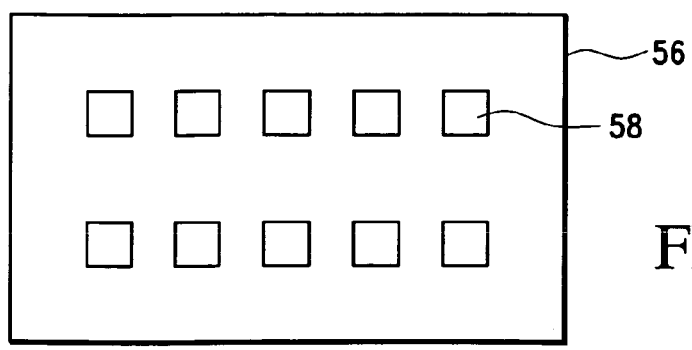

The keyboard membrane 60 further includes an insulating membrane 56, with a corresponding plurality of holes 58. As shown in FIGS. 8 and 9C, the holes 58 are located so that a first key button pad 52a, when its corresponding the keyboard button 46a is pressed by a user, touches a corresponding second key button pad 52b, completing a circuit. The circuit completion can provide a logic level "1" or logic level "0", as desired and subsequently interconnected, to an attached device (not shown). The insulating membrane keeps the key button conductive traces 54 from touching each other or other components.

Figure 10:
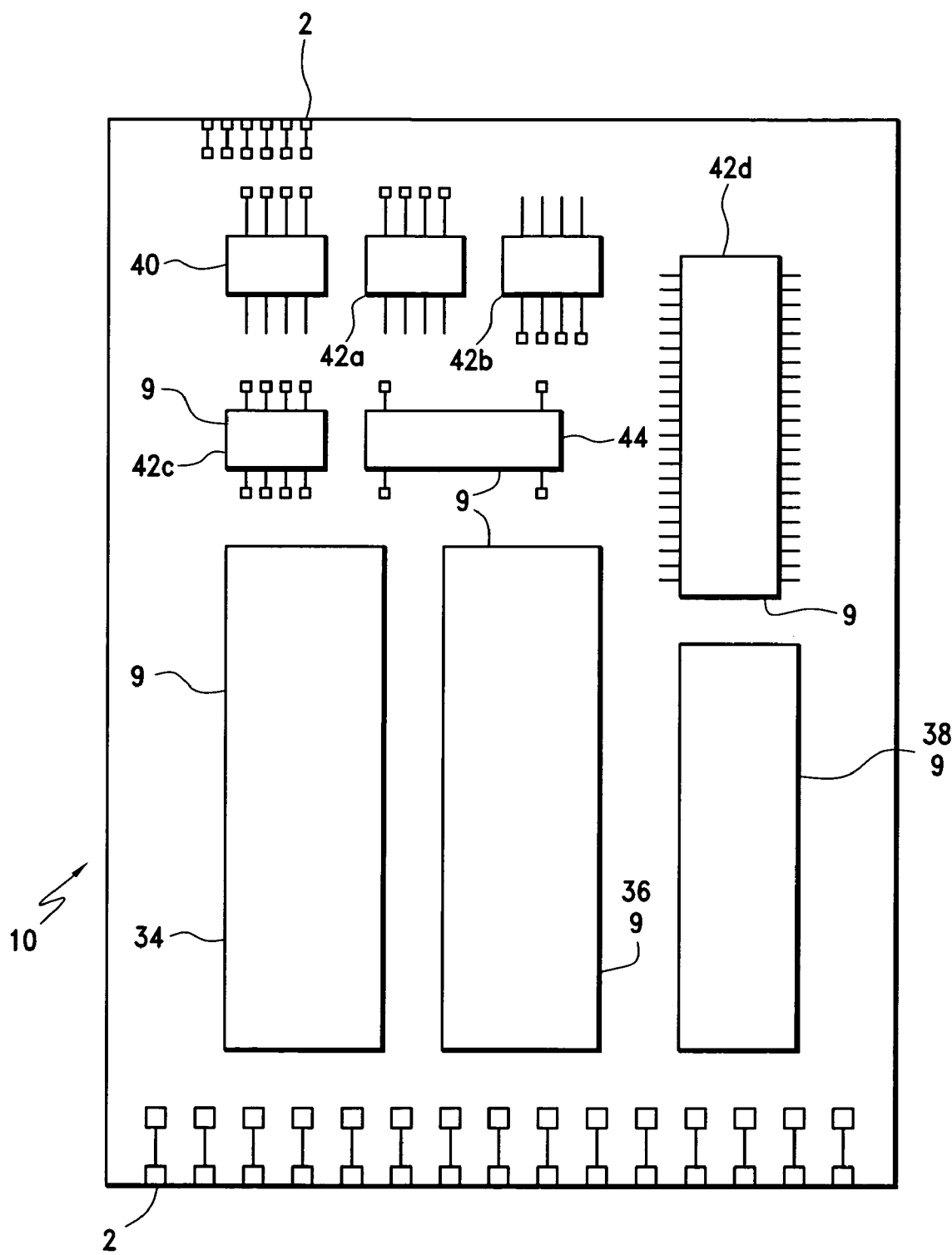
FIG. 10 illustrates a top view of a substrate pre-provided with pre-printed functional blocks of electronic devices and other pre-printed electronic devices for use with the direct printing system shown in FIG. 1, and the process described in reference to FIG. 11.

FIG. 10 illustrates a top view of a substrate pre-provided with pre-printed functional blocks of electronic devices 9 and other pre-printed electronic devices 9 for use with the direct printing system 200 shown in FIG. 1, and the process described in reference to FIG. 11 (which is discussed in detail below). In FIG. 10, the functional blocks of electronic devices 9 include a PROM 34, a resistor array 36, a display driver 38, line driver/receiver 40, logic devices 42a-42c, and a processor 44. The configuration of the custom printed circuit board 10 shown in FIG. 10 represents only one exemplary embodiment of the present invention, from among numerous embodiments in which the major functions of the custom printed circuit board 10 have been carefully provided, but not the exact interconnection, thereby allowing the user to customize the ultimate design as needed from board to board.

The custom printed circuit board 10 in this exemplary embodiment of the present invention is not to be construed, as those of ordinary skill in the art of the present invention can appreciate, as limiting in any manner: the custom printed circuit board 10 shown in FIG. 10 merely provides an illustrative example of how one such custom printed circuit board can be provided to a user. In this instance, the custom printed circuit board 10 is pre-provided with a plurality of electronic device 9. The plurality of electronic devices 9 includes a pre-printed PROM 34, display driver 38, resistor array 36 and other circuits. The resistor array 36 can be used for pull-up or pull-down resistors, current limiting resistors, voltage dividers and other uses. Display driver 38 can either be an array of transistors 12 that can be used to drive an electronic ink (e-ink) display, or a resistor array 36 that can be used to drive a thermo-chromic display, as described above. A specific exemplary use of this custom printed circuit board according to an embodiment of the present invention is in disposable consumer packages. Such packages can be used to persuade a potential customer to purchase the contents therein.

Figure 11:
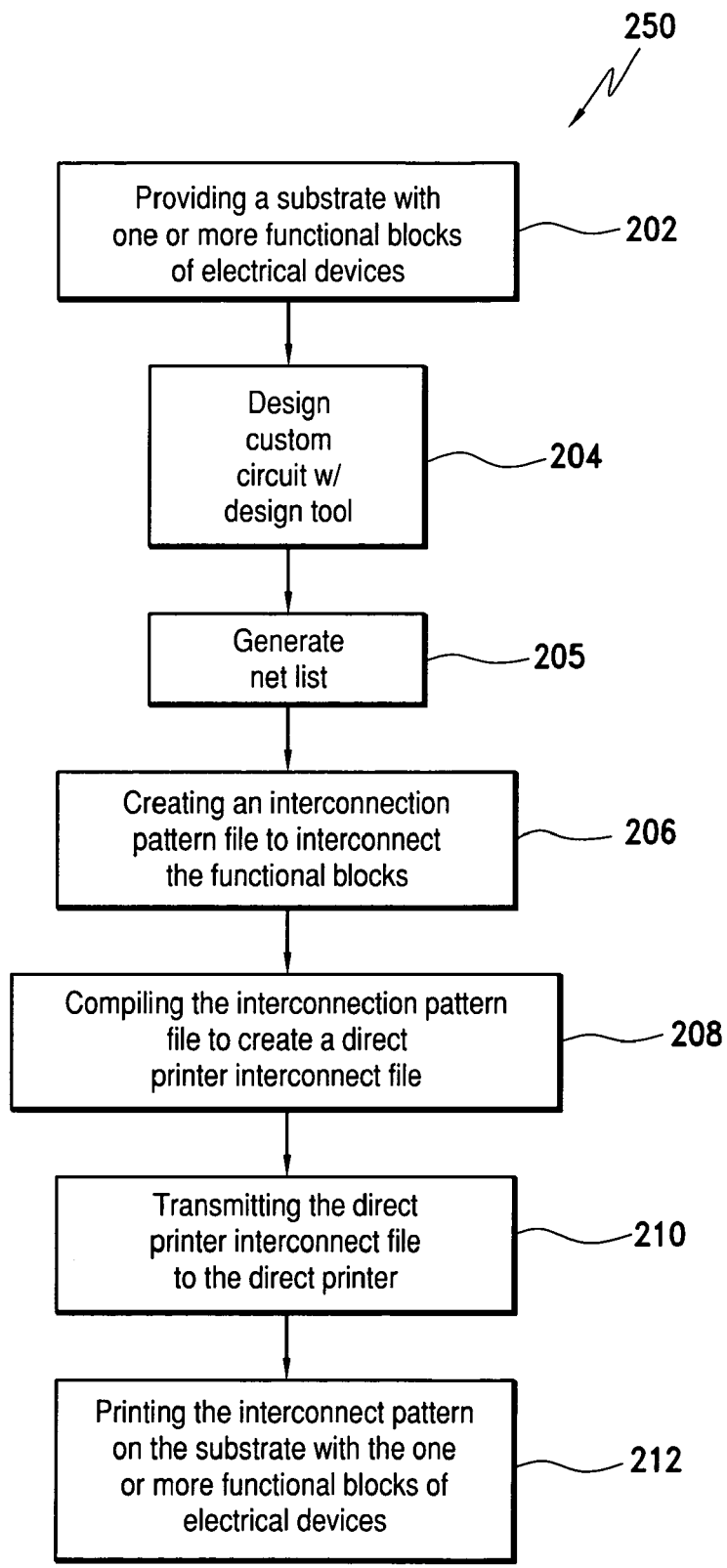
FIG. 11 illustrates a flow diagram of an alternative process for manufacturing custom printed circuits according to an embodiment of the present invention.

FIG. 11 illustrates a flow diagram of an alternative process 250 for creating a custom printed circuit board 10, as shown in FIG. 10, according to an embodiment of the present invention. In step 202, a user is provided with a substrate 8 that includes one or more pre-provided functional blocks of electronic devices 9. Using the above-described design tool, in step 204, the user designs the custom printed circuit board 10 using the one or more of the pre-provided functional blocks of electronic devices. As discussed above in reference to process 100, designing the custom printed circuit board from the one or more pre-provided functional blocks of electronic devices 9 includes creating an interconnection pattern file in the design tool to connect the one or more functional blocks of electronic circuits from a library that defines the custom printed circuit board 10 in terms of the functional blocks of electronic devices.

Substrate 8, in regard to any of the processes and uses discussed herein, has generally been described as including both direct printed ink resistors, capacitors and transistors, along with standard integrated circuits, albeit in various different packaging technologies (surface mount, dual in line packaging, among others). According to another exemplary embodiment of the present invention, any pre-provided electronic device 9 can be manufactured from polymer based and/or inorganic ink solution. Direct printing of electronic devices using these inks provides several distinct advantages including the reduction of cost, the ability to customize the electronic circuit on the individual substrate, the ability to embed the device inside a multilayer structure, and the ability to hard-wire specific digital information into the device. According to this exemplary embodiment of the present invention, printed transistors can be pre-provided by the manufacturer of the substrate 8 by using a lithographic offset printing process. The lithographic offset printing process provides greater resolution than several of the other direct printing processes, as discussed above. Photolithographic processes (similar to those used in traditional IC manufacturing) can also be used in conjunction with direct deposition processes such as ink jet, spin coat, and high speed printing processes such as offset, flexography, and gravure printing.

In step 204, the user accesses the design tool that includes circuit device symbols of all the pre-provided functional blocks of electronic devices. The design tools available to the user of the direct printing system 200 include a combination of two or more conventional electronic circuit design tools, proprietary software designed for use on a particular embodiment of the direct printing system 200, or can be other well known software design tools for creating electronic circuits. Each type of design tool is well known to those of ordinary skill in the art of the present invention. Examples of well known software design tools for creating electronic circuits include a very high speed integrated circuit (VHSIC) hardware description language (VHDL) software tool.

The user picks-and-places each circuit device symbol onto a circuit board design screen, and draws the interconnections paths (i.e., conductive traces 24) between one or more terminals (i.e., pads) of the circuit device symbols. The design tool can access a separate or integrated library (i.e., one that is provided with the design tool) that contains all the pre-provided functional blocks of electronic devices 9 on the substrate 8. The library, or libraries, can reside in a suitable computer assisted engineering (CAE) software tool.

Once the user completes the design to perform one or more desired electronic functions, the analysis tool can be used to perform an analysis of the design (i.e., does it do what the user thinks it should do), and verify the integrity of the design, i.e., will it still perform accurately under various operating conditions (temperature, voltage changes, among others). The final design is then saved by the design tool. The design tool then creates a net list in step 205. Net lists, as discussed above, are a simple list of interconnected points.

In step 206, the design tool then generates a file of pad interconnection paths, based, in part, on the net list. In step 208, the user compiles the interconnection pattern file to create a direct printer readable interconnection file. The direct printer readable interconnection file is one that can be read by the direct printer system 200, and contains data that specifically directs the direct printer system 200 to put conductive traces in various physical locations. The user can also use a second (or first) analysis tool to verify the integrity of the design. The second analysis tool can be used to verify that, given the exact physical layout the design tool created in the direct printer readable interconnection file, an analysis of design shows that it will still perform accurately under various operating conditions (temperature, voltage changes, among others) with the given characteristics of the pre-provided substrate 8. If the results are not completely to the satisfaction of the user, the user can re-design the custom printed circuit 10, or command the design tool to re-layout the interconnection paths. Step 208 is substantially similar to step 108 of process 100 described above.

In step 210, the direct printing system 200 transmits the direct printer readable interconnection file to the direct printer system 200. In step 212, the direct printer system 200 performs the direct printing process such that one or more conductive traces are printed between the one or more functional blocks of the electronic devises to form the designed custom printed circuit board 10 (again, steps 210, 212 are substantially similar to steps 110, 112 of process 100 described above). According to an exemplary embodiment of the present invention, the step of direct printing includes ink jet printing the one or more conductive paths using an ink composition that includes conductive particles in a solution, and curing the printed ink composition to create a conductive trace 24 with a desired conductivity.

According to an exemplary embodiment of the present invention, the pre-provided functional blocks of electronic circuits includes transistors, resistors, capacitors, inductors, buffer circuits, transmitter and receiver circuits, input/output circuit devices, input/output terminals, memory circuits, line drivers, microprocessors, display devices, sensor devices, and the like. According to an exemplary embodiment of the present invention, the transistors can be provided as an array of one or more transistors that have been direct printed on the substrate 10, and the display device can include an e-ink media (or any of the other type of display discussed above) with an array of transistors. The array of transistors can be provided in a programmable read-only memory (ROM) configuration.

Figure 12:
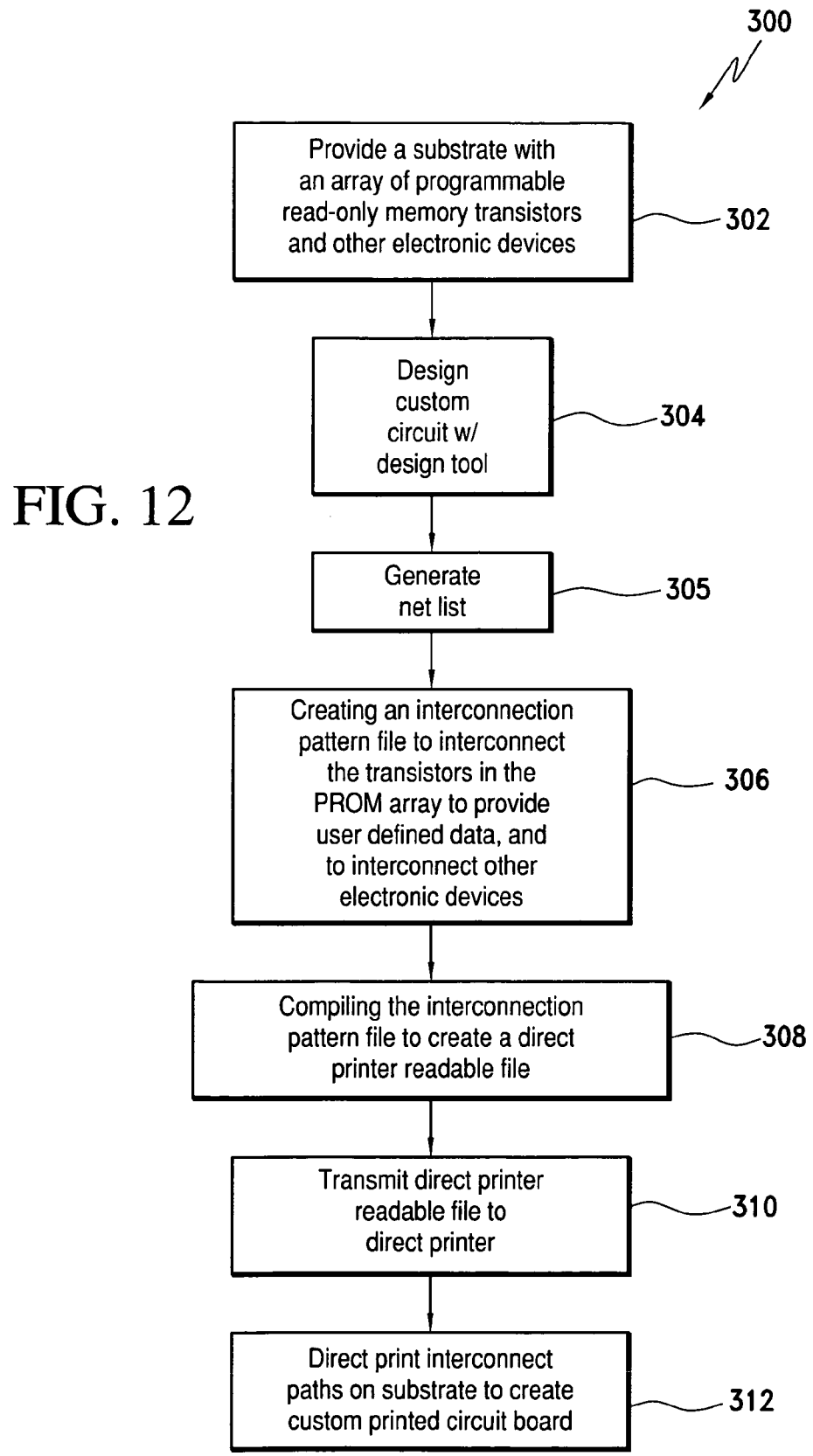
FIG. 12 illustrates a flow diagram of a process for creating a programmable read-only memory custom printed circuit board according to an embodiment of the present invention.

FIG. 12 illustrates a flow diagram of a process 300 for creating a programmable read-only memory (ROM) custom printed circuit board 10 using the direct printing system 200 according to an embodiment of the present invention. Process 300 begins with step 302, in which the user is provided with a substrate that is pre-provided with an array of transistors. The array of transistors is configured as an array of programmable read-only memory transistors. Other electronic devices 9 can also be pre-provided on the substrate 8. The transistors are configured as shown in FIG. 5, which was discussed above. As discussed above, in order to program a logic level "1," a conductive trace 24 must be placed between emitter pad 14 and fuse pad 32. If a logic level "0" is desired, no conductive trace 24 is printed for that particular memory location.

In step 304, the user uses the design tool to design the custom printed circuit, in this case, a programmable read-only memory (PROM). In step 304, the user, with the design tool, creates the design of the PROM with user defined data. User defined data defines the digital information, or data, that is to be stored in the PROM, and can be obtained from many different sources. According to an exemplary embodiment of the present invention, the user defined data can originate from a keyboard associated with the direct printer system 200, or a stand alone PC, among other sources. In addition, the user can use the design tool to create additional interconnections between the transistors of the PROM array, and the other electronic devices 9 that can be pre-provided on the substrate 8. For example, printing conductive traces 24 to and from the terminal connectors 8 provides external access to the user defined data, and printing from the PROM transistor array to a processor provides internal access to the user defined data. As one of ordinary skill in the art can appreciate, the design tools available to the user can create a PROM design based on user defined data substantially automatically. Following step 304, the balance of the process 300 is substantially similar to that described in reference to process 100, and will not be discussed in detail for purposes of brevity. In step 305, a net list is generated; in step 306, an interconnection pattern file is generated using data from the net list; in step 308 the interconnection pattern file is compiled into a format that the direct printer system 200 can understand (this need not be electronic, as discussed above: in the case of lithographic offset printing (and gravure printing), physical plates are made from the interconnection pattern file(s)); in step 310, the direct printer readable file is transmitted to the direct printer system 200; and in step 312, the interconnection paths (or simple electronic devices 9) are printed on the substrate 8.

Figure 13:
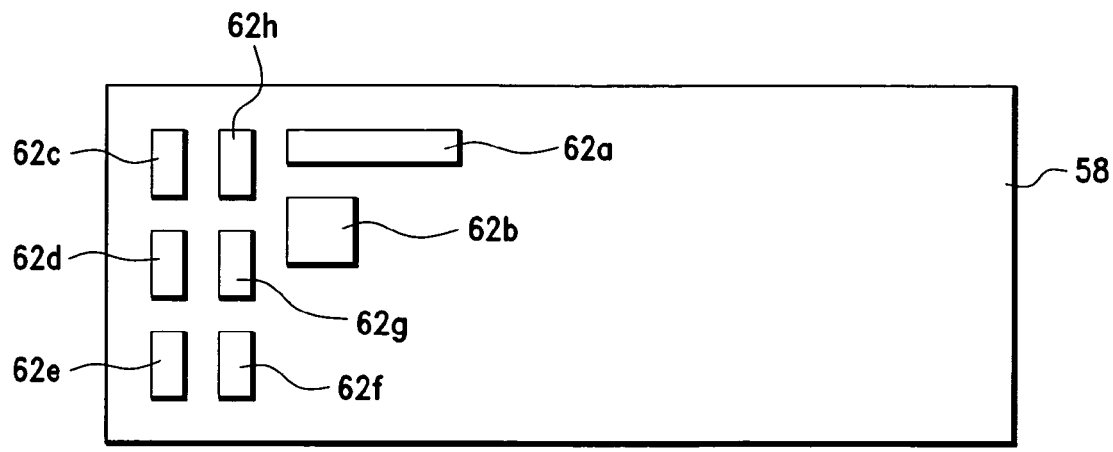
FIG. 13 illustrates a first side of a conventional printed circuit board substrate, populated with a set of conventional integrated circuits.

FIG. 13 illustrates a first side of a conventional printed circuit board substrate (conventional PCB) 58, populated with a set of conventional integrated circuits (ICs) 62. The conventional PCB 58 is provided with a set of conventional ICs that can form all or part of one or more electronic functions. In the conventional PCB 58, however, not all interconnections between ICs 62 and other active or passive components and I/O terminals have been made. Therefore, a user of the conventional PCB 58 has the ability to customize the conventional PCB 58 to create a custom printed circuit board 10. The new custom printed circuit board 10 will then have one or more electronic functions customized to the user's needs. Certain electronic functions will be completed in the conventional PCB 58. For example, power and ground connections, data and command buses, and I/O drivers and receivers. Other types of circuitry, both digital and analog, can be provided that are not interconnected to provide a particular electronic function. For example, the electronic function of a conventional PCB 58 with conventional ICs 62 can be a board that includes a processor, I/O circuits, display drivers, and displays that processes received data to display different messages depending on what data is received.

Figure 14A:
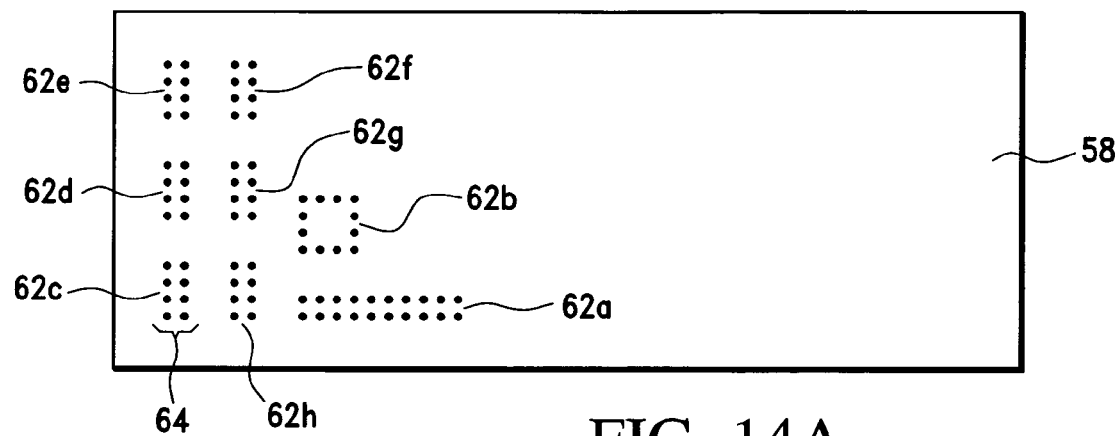
FIGS. 14A and 14B illustrate a second side of the conventional printed circuit board substrate shown in FIG. 13, before and after a set of conductive traces has been direct printed thereon, to form a custom printed circuit board comprising one or more electronic functions.
Figure 14B:
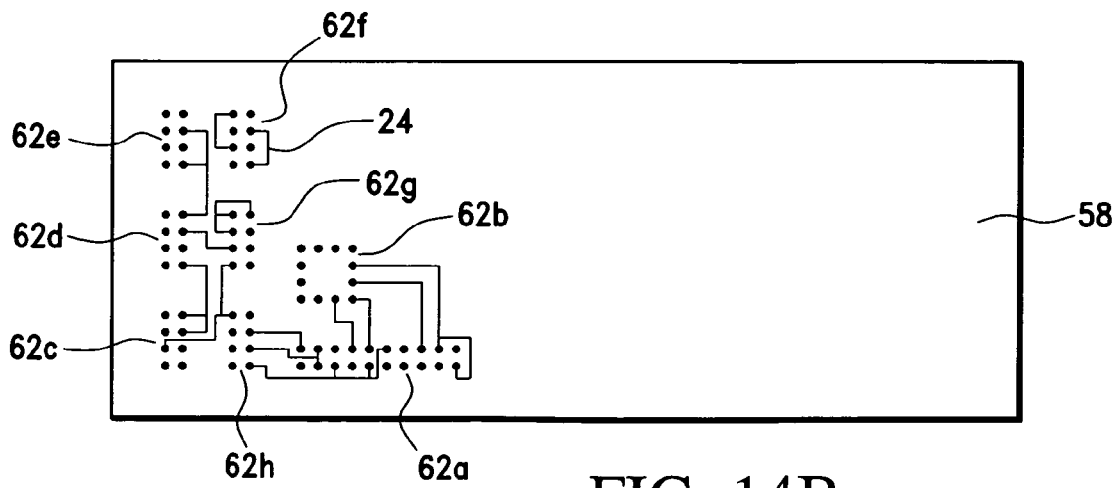

Customization of the custom printed circuit board 10 can be achieved by direct printing application-specific conductive traces 24 on a second side of the conventional PCB 58 (see FIGS. 14A and 14B). The application specific conductive traces 24 can be designed using the design tool, which will have a file that represents the conventional PCB 58 and all the components included therein. Then, a manufacturer can produce just as many as is necessary of each type of the custom printed circuit boards 10 from conventional PCBs 58 based on their customer's needs. In addition, the user can use the design tool to print other electronic devices 9 as desired. Any of the electronic devices discussed above in reference to FIGS. 2, 3A, 7, 8, and 10 can be direct printed on the conventional PCB 58. Of course, depending on the type of material the conventional PCB 58 is made from will dictate, to a certain extent, what direct printing process can be used, and what specific electronic device can be direct printed thereon. In an exemplary embodiment of the present invention, the electronic devices can include transistors, resistors, capacitors, conductive traces 24 in the form of membrane keyboards, actuators, transducers, display drivers (transistor and resistor arrays), even photovoltaic cells and batteries can be direct printed on the conventional PCB 58

FIG. 14B illustrates a second side of the conventional printed circuit board 58 shown in FIG. 13, with a set of conductive traces 24 direct printed thereon, to form a custom printed circuit board 10 comprising one or more electronic functions. Prior to designing the custom printed circuit board 10, and direct printing the conductive traces 24, the conventional PCB 58 contains no conductive traces 24 on its second side, as shown in FIG. 14A.

According to a non-limiting exemplary embodiment of the present invention, a custom printed circuit board 10 can be manufactured for use in the automotive industry, which is incorporating greater amounts of electronics into their automobiles in order to maximize safety, performance, and fuel efficiency. In an exemplary embodiment of the present invention, a custom printed circuit board 10 can be provided that includes a first electronic function to process automotive diagnostic signals that in turn produces warning signals. A second, related electronic function, could be to evaluate engine performance signals including valve timing, fuel flow, engine temperature, air temperature, cylinder temperature, air pressure and other parameters that indicates how well the engine is running (i.e., to increase engine performance). The diagnostic and performance signals are similar in nature, but used for different purposes, and in different ways. The diagnostics signals simply provide warning signals to the operator of the motor vehicle, while the performance signals are processed and evaluated to improve engine performance. An automotive electronics manufacturer could develop a large and expensive conventional PCB 58 to monitor and process both diagnostic and performance signals on one conventional PCB 58. Using the direct printing system 200 according to an exemplary embodiment of the present invention, however, the automotive electronics manufacturer can design two different layouts for one custom printed circuit board 10 that uses less parts and a simpler, more customized set of software code (for each application) that accomplishes the goals of monitoring the automotive diagnostics signals and the engine performance signals less expensively on separate custom printed circuit boards 10. Another example includes a similar type of processing board manufactured by an electronics manufacturing company that can use the direct printing system 200 according to an exemplary embodiment of the present invention to provide different electronic functions to different customers.

The exemplary embodiment described above is but one particular non-limiting example of the types of circuits that the system and process according to an embodiment of the present invention can manufacture. The system and process according to an embodiment of the present invention can be used to create generic circuit boards, with only certain necessary interconnects provided (power, ground, and some data lines, for example), wherein various users will design and direct print conductive traces 24 and perhaps other electronic devices to completely customize the circuit.

Figure 15:
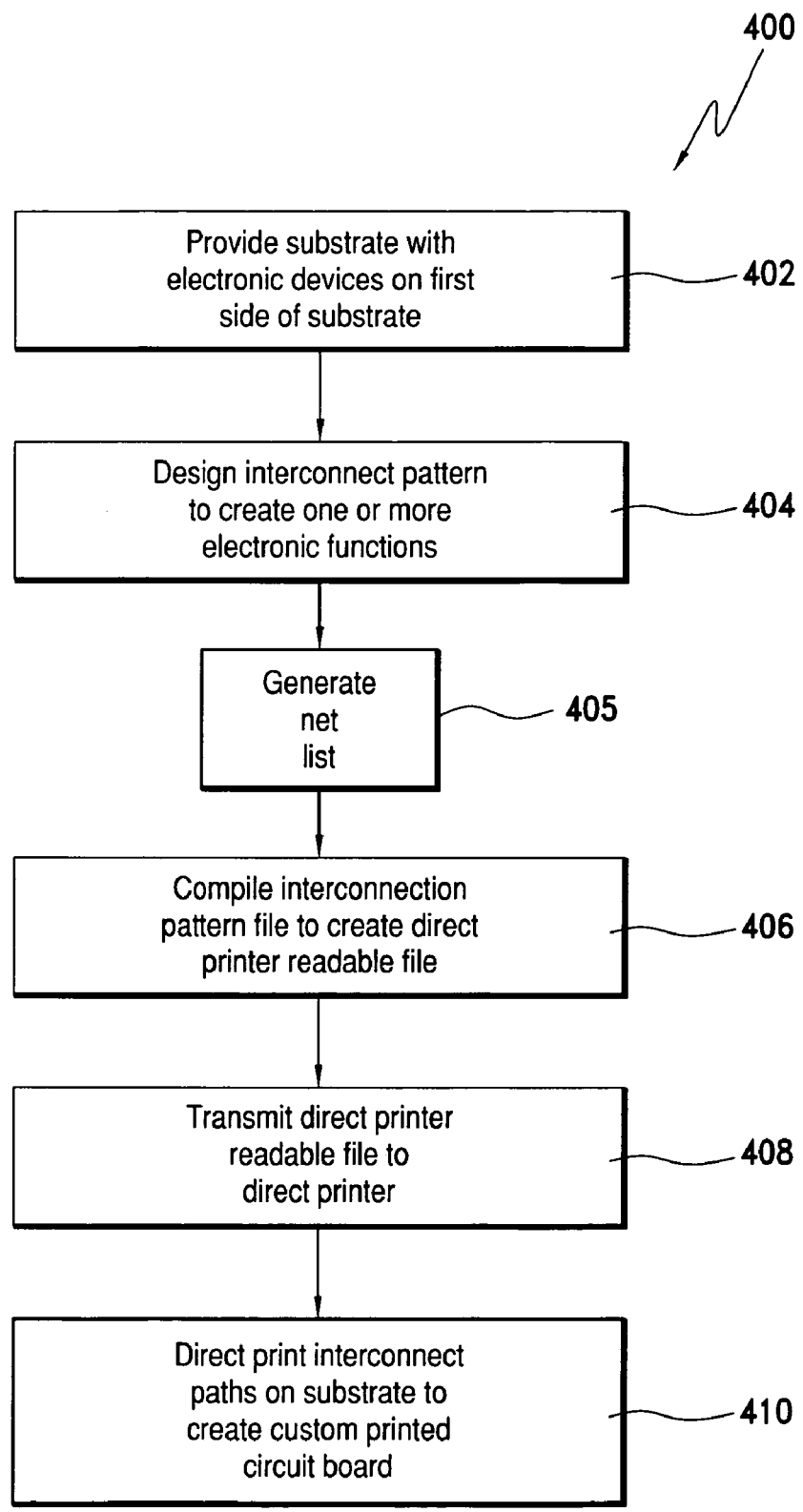
FIG. 15 illustrates a flow diagram of a process for manufacturing a custom printed circuit board comprising conventional printed circuit board populated on a first side with conventional standard integrated circuits, and a second side with a set of conductive traces direct printed thereon.

FIG. 15 illustrates a flow diagram of a process 400 for manufacturing a custom printed circuit board 10 comprising a conventional PCB 58 populated on a first side with one or more conventional standard integrated circuits 62, and a second side with a set of conductive traces 24 direct printed thereon. Process 400 begins with step 402, wherein a conventional PCB 58 is provided populated with standard integrated circuits 62, providing a set of conventional interconnected electronic devices on a substrate.

In step 404, a user designs an interconnection pattern between the set of interconnected electronic devices to create one or more desired electronic functions. The step of using a design tool for designing the interconnection on a conventional PCB 58 is similar to the step of designing the custom printed circuit board 10 as previously discussed in reference to process 100 and FIG. 3, and will not, therefore, be discussed in detail for purposes of brevity. A difference between the previously discussed design step 104 and design step 404, is that the design tool in step 404 provides circuit device symbols that represent the standard integrated circuits 62 on the conventional PCB 58, and their known electronic functions and interconnections. The design tool can display the second side of the conventional PCB 58 to the user and the user can them draw interconnections paths between the pads 64. Superimposed over the pads 64 can be the corresponding conventional standard IC 62.

After the user has completed the design to customize the conventional PCB 58, the user can run the first analysis tool (to verify the design and test its operation versus different operating parameters). Then in step 405, a net list is generate, which, as discussed in greater detail above, generates a list of all components and pins of integrated circuits that are connected to each other. Following step 405, the user compiles the interconnection path data file (step 406).

Following the step of compiling of the interconnection data file, the user can run the second analysis tool, to verify the design as it has been layed-out on the conventional PCB 58. This data is then transmitted to the direct printer system 200 in step 408, and direct printed in step 410. The latter steps, steps 406, 408 and 410 of process 400, are substantially identical to steps 106, 108 and 110 of process 100, respectively, as discussed above with respect to an embodiment of the present invention.

According to an alternative exemplary embodiment of the present invention, the set of conventional standard IC's 62 can be located on both sides of the conventional PCB 58, and the pads 68 can be on either or both sides. In this instance, the conventional PCB 58 is made of a flexible substrate material, for example, PET, which is a low cost substrate material. The design tool can then present the side of the conventional PCB 58 that contains the pads 68 (or both, if necessary).

Another alternative embodiment of the present invention adds the option of designing direct printed electronic devices onto the conventional PCB 58 at any location (on either side) where there is room for them. By designing in and adding direct printed electronic devices, a user can add an electronic device without having to redesign and re-layout the conventional PCB 58. Designing and direct printing electronic devices to the conventional PCB 58 maximizes the versatility of the conventional PCB 58 and the ability of the direct printing system to customize a custom printed circuit board 10 to a user's particular needs. The step of designing an additional directed printed electronic devices, is substantially similar to the step of designing electronic devices discussed above in reference to the flow diagrams of FIGS. 3 and 9, and process steps 104 and 204.

In accordance with an embodiment of the present invention, the direct printing system 200 can also provide a means for correcting or repairing the custom printed circuit board 10. For example, the print head 78 of the direct printing system 200 can be connected to an ink reservoir 80 that contains a solvent fluid. The solvent fluid can be direct printed onto the custom printed circuit board in the areas in need of repair, destroying insulating layers 22 and conductive traces 24. The direct printing system 200 can then re-fabricate the conductive traces as originally intended.

Figure 16:
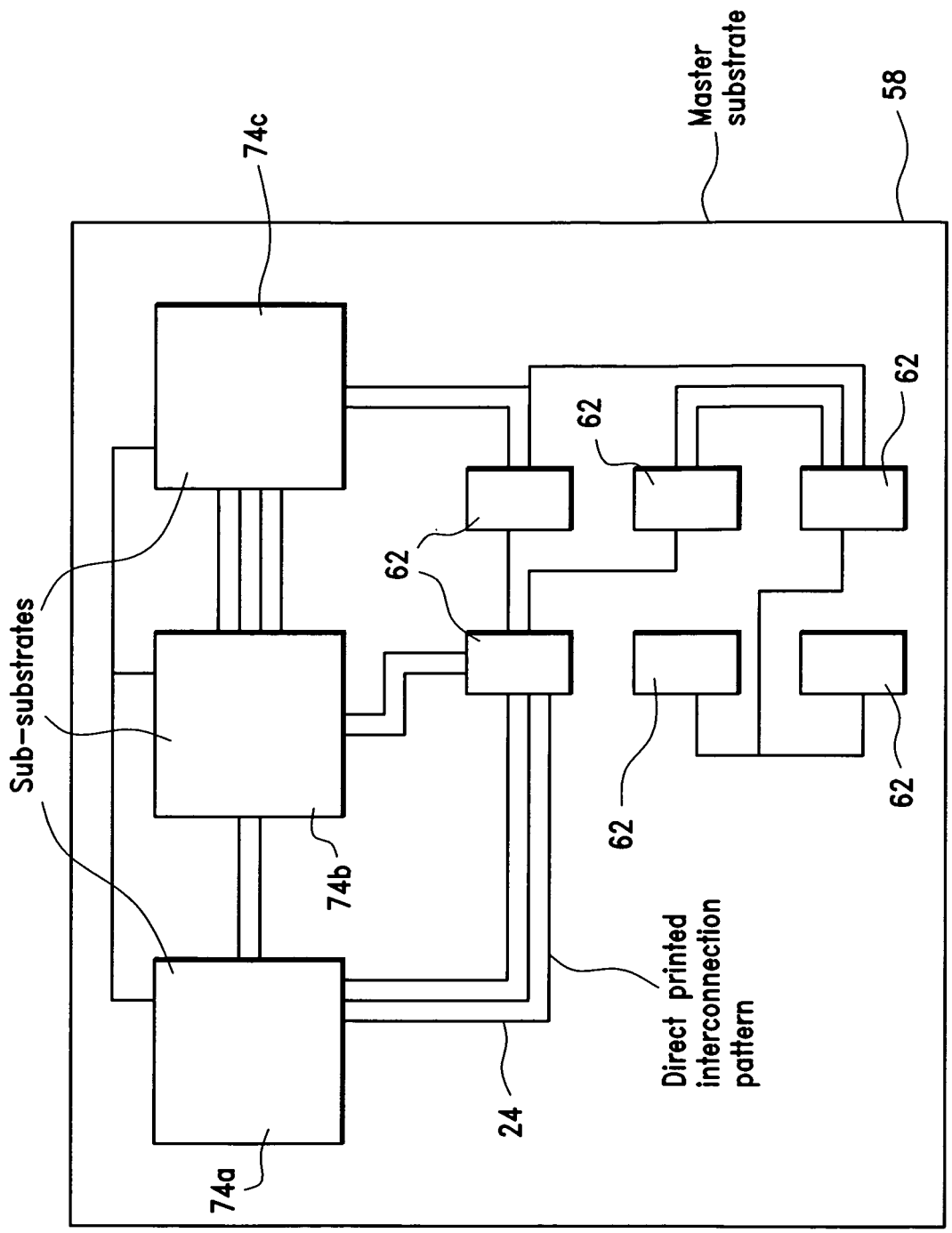
FIG. 16 illustrates a top view of a conventional printed circuit board master substrate after sub-substrates have been located on the master substrate and conductive traces direct printed thereon.

FIG. 16 illustrates a top view of a conventional printed circuit board master substrate 58 after sub-substrates 74a-74c have been located on the master substrate and conductive traces 24 direct printed thereon. In the exemplary embodiment of the present invention shown in FIG. 16, the conventional PCB master substrate 58 has added to it several smaller sub-substrates 74a-74c. Each of the sub-substrates 74a-74c has its own electronic function. In some situations, one might be an extended memory circuit, or additional processing capabilities (i.e., digital signal processor or a microprocessor), or an analog-to-digital converter, or a digital-to-analog converter, among others. Whatever the capabilities each sub-substrate 74 provides, the user of the system and process according to an embodiment of the present invention can design its function into the conventional PCB master substrate 58, and further design conductive traces 24, transistors 12, resistors and capacitors, or any other type of electronic device 9 that can be direct printed on the particular type of substrate material 8.

All United States patents and applications, foreign patents, and publications discussed above are hereby incorporated herein by reference in their entireties.

The present invention has been described with reference to certain exemplary embodiments thereof. However, it will be readily apparent to those skilled in the art that it is possible to embody the invention in specific forms other than those of the exemplary embodiments described above. This may be done without departing from the spirit and scope of the invention. The exemplary embodiments are merely illustrative and should not be considered restrictive in any way. The scope of the invention is defined by the appended claims and their equivalents, rather than by the preceding description.

What is claimed is:

1. A process for creating a custom printed circuit with one or more custom electronic functions comprising:
   a) providing a set of conventional interconnected electronic devices on a substrate;
   b) direct printing on the substrate an interconnection pattern between the set of conventional interconnected electronic devices to create the one or more custom electronic functions;
   c) providing a set of custom electronic devices that can be direct printed on an alternate side of the substrate from the set of conventional interconnected electronic devices;
   d) providing an interconnection pattern between the set of conventional interconnected electronic devices and the provided set of direct printed custom electronic devices; and
   e) direct printing both the provided set of custom electronic devices and the interconnection pattern between the set of conventional interconnected electronic devices and the provided set of direct printed custom electronic devices.

2. The process according to claim 1, wherein the set of conventional interconnected electronic devices are located on a first side of the substrate, and the interconnection pattern is provided on a second side of the substrate.

3. The process according to claim 1, wherein the set of conventional interconnected electronic devices are located on alternate sides of the substrate, and the interconnection pattern is provided on alternate sides of the substrate.

4. A process for creating a custom printed circuit with one or more custom electronic functions comprising:
   a) providing a master substrate pre-provided with one or more conventional integrated circuits;
   b) providing one or more sub-substrates, wherein each sub-substrate comprises one or more interconnected electronic devices to perform one or more electronic sub-functions;
   c) providing a set of custom electronic devices that can be direct printed on the sub-substrate;
   d) providing an interconnection pattern between the one or more sub-substrates, the provided set of custom electronic devices, and the pre-provided conventional integrated circuits on the master substrate;
   e) fixedly placing the one or more sub-substrates on the master substrate; and
   f) direct printing both the provided set of custom electronic devices and the provided interconnection pattern on the one or more substrates to provide the custom printed circuit with one or more of the custom electronic functions that is a combination of the sub-functions of the sets of interconnected electronic devices.

5. A system for creating a custom printed circuit with one or more custom electronic functions on a substrate pre-provided with a set of conventional interconnected electronic devices comprising:
   a) a processor configured to provide an interconnection pattern between the set of conventional interconnected electronic devices to create the one or more custom electronic functions; and
   b) a direct printing device configured to print the interconnection pattern on the substrate to provide the custom printed circuit board with the one or more custom electronic functions, and wherein
      the processor is further configured to
         provide a set of custom electronic devices that can be direct printed on an alternate side of the substrate from the set of conventional interconnected electronic devices; and
         direct print on the substrate the provided set of custom electronic devices, and an interconnection pattern between the set of conventional interconnected electronic devices and the provided set of direct printed custom electronic devices.

6. The system according to claim 5, wherein the set of conventional interconnected electronic devices are located on a first side of the substrate, and the interconnection pattern is provided on a second side of the substrate.

7. The system according to claim 5, wherein the set of conventional interconnected electronic devices are located on alternate sides of the substrate, and the interconnection pattern is provided on alternate sides of the substrate.

8. A system for creating a custom printed circuit with one or more custom electronic functions using a master substrate pre-provided with one or more conventional integrated circuits comprising:
   a) one or more sub-substrates fixedly placed on the master substrate, wherein each sub-substrate comprises one or more interconnected electronic devices to perform one or more electronic sub-functions;
   b) a processor configured to provide a set of custom electronic devices that can be direct printed on each of the sub-substrates, and provide an interconnection pattern between the one or more sub-substrates, the provided set of custom electronic devices, and the pre-provided conventional integrated circuits on the master substrate, wherein one or more sub-substrates has been fixedly placed on the master substrate; and
   c) a direct printing device configured to print both the provided set of custom electronic devices and the provided interconnection pattern on the one or more sub-strates to provide the custom printed circuit with one or more of the custom electronic functions that is a combination of the sub-functions of the sets of interconnected electronic devices.

9. A computer-readable medium containing a computer program as executed by a computer for creating a custom printed circuit with one or more custom electronic functions on a substrate provided with a set of conventional interconnected electronic devices, wherein the computer program performs the steps of:
   a) causing a direct printing device to print an interconnection pattern on the substrate between the set of conventional interconnected electronic devices to create the one or more custom electronic functions;
   b) providing a set of custom electronic devices that can be direct printed on an alternate side of the substrate from the set of conventional interconnected electronic devices:
   c) providing an interconnection pattern between the set of conventional interconnected electronic devices and the provided set of direct printed custom electronic devices; and
   d) causing a direct printing device to print both the provided set of custom electronic devices and the interconnection pattern between the set of conventional interconnected electronic devices and the provided set of direct printed custom electronic devices on the substrate.

10. The computer program according to claim 9, wherein the set of conventional interconnected electronic devices are located on a first side of the substrate, and the interconnection pattern is provided on a second side of the substrate.

11. The computer program according to claim 9, wherein the set of conventional interconnected electronic devices are located on alternate sides of the substrate, and the interconnection pattern is provided on alternate sides of the substrate.

12. A computer-readable medium containing a computer program as executed by a computer for creating a custom printed circuit with one or more custom electronic functions using a master substrate pre-provided with one or more conventional integrated circuits, and one or more sub-substrates fixedly placed on the master substrate, wherein each sub-substrate comprises one or more interconnected electronic devices to perform one or more electronic sub-functions, wherein the computer program performs the steps of:
   a) providing a set of custom electronic devices that can be directed printed on the sub-substrate;
   b) providing an interconnection pattern between the one or more sub-substrates, the provided set of custom electronic devices, and the pre-provided conventional integrated circuits on the master substrate; and
   c) causing a direct printing device to print both the provided set of custom electronic devices and the provided interconnection pattern to provide the custom printed circuit with one or more of the custom electronic functions that is a combination of the sub-functions of the sets of interconnected electronic devices on the one or more substrates.

13. A system for creating a custom printed circuit with one or more custom electronic functions on a substrate provided with a set of conventional interconnected electronic devices, comprising:
   a) means for providing an interconnection pattern between the set of conventional interconnected electronic devices to create the one or more custom electronic functions;
   b) means for direct printing the interconnection pattern on the substrate to provide the custom printed circuit board with the one or more custom electronic functions;
   c) means for providing a set of custom electronic devices that can be direct printed on an alternate side of the substrate from the set of conventional interconnected electronic devices; and
   d) means for direct printing on the substrate the provided set of custom electronic devices, and an interconnection pattern between the set of conventional interconnected electronic devices and the provided set of direct printed custom electronic devices.

14. The system according to claim 13, wherein the set of conventional interconnected electronic devices are located on a first side of the substrate, and the interconnection pattern is provided on a second side of the substrate.

15. The system according to claim 13, wherein the set of conventional interconnected electronic devices are located on alternate sides of the substrate, and the interconnection pattern is provided on alternate sides of the substrate.

16. A system for creating a custom printed circuit with one or more custom electronic functions using a master substrate pre-provided with one or more conventional integrated circuits, comprising:

a) means for providing one or more sub-substrates fixedly placed on the master substrate, wherein each sub-substrate comprises one or more conventional interconnected electronic devices to perform one or more electronic sub-functions;

b) means for providing a set of custom electronic devices that can be direct printed on each of the sub-substrates;

c) means for direct printing an interconnection pattern between the one or more sub-substrates, the pre-provided conventional integrated circuits on the master substrate, and the provided set of custom electronic devices; and d) means for direct printing both the provided set of custom electronic devices and the interconnection pattern to provide the custom printed circuit with one or more of the custom electronic function that is a combination of the sub-functions of the sets of interconnected electronic devices on the one or more substrates.

* * * * *